(12) United States Patent
Harasaka et al.

(10) Patent No.: US 8,736,652 B2
(45) Date of Patent: May 27, 2014

(54) SURFACE-EMITTING LASER DEVICE, SURFACE-EMITTING LASER ARRAY, OPTICAL SCANNER, IMAGE FORMING APPARATUS, AND METHOD FOR MANUFACTURING SURFACE-EMITTING LASER DEVICE

(75) Inventors: Kazuhiro Harasaka, Miyagi (JP); Shunichi Sato, Miyagi (JP); Masahiro Hayashi, Miyagi (JP); Akihiro Itoh, Miyagi (JP); Katsunari Hanaoka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/379,160

(22) PCT Filed: May 18, 2011

(86) PCT No.: PCT/JP2011/061918
§ 371 (c)(1),
(2), (4) Date: Dec. 19, 2011

(87) PCT Pub. No.: WO2011/148957
PCT Pub. Date: Dec. 1, 2011

(65) Prior Publication Data
US 2013/0070039 A1   Mar. 21, 2013

(30) Foreign Application Priority Data

May 25, 2010   (JP) .................................. 2010-118940
Mar. 9, 2011   (JP) .................................. 2011-050962

(51) Int. Cl.
*B41J 2/45* (2006.01)
*H01S 5/00* (2006.01)

(52) U.S. Cl.
USPC .................................... 347/238; 372/50.124

(58) Field of Classification Search
USPC ............ 347/224, 225, 238; 372/43.01, 49.01, 372/50.11, 50.123, 50.124
See application file for complete search history.

(56) References Cited

U.S. PATENT DOCUMENTS

| 5,923,691 | A | 7/1999 | Sato |
|---|---|---|---|
| 5,939,733 | A | 8/1999 | Sato |

(Continued)

FOREIGN PATENT DOCUMENTS

| EP | 1130720 A1 | 9/2001 |
|---|---|---|
| JP | 2000-208811 | 7/2000 |

(Continued)

OTHER PUBLICATIONS

International Search Report and Written Opinion in PCT/JP2011/061918.

(Continued)

*Primary Examiner* — Hai C Pham
(74) *Attorney, Agent, or Firm* — Cooper & Dunham LLP

(57) ABSTRACT

A surface-emitting laser device includes a transparent dielectric layer provided in an emitting region and configured to cause a reflectance at a peripheral part to be different from a reflectance at a central part in the emitting region. In the surface-emitting laser device, the thickness of a contact layer is different between a region having a relatively high reflectance and a region having a relatively low reflectance in the emitting region. The contact layer is provided on the high refractive index layer of an upper multilayer film reflecting mirror, and the total optical thickness of the high refractive index layer and the contact layer in the region having the relatively low reflectance is deviated from an odd number multiple of a one quarter oscillation wavelength of laser light emitted from the emitting region.

10 Claims, 30 Drawing Sheets

(56) References Cited

U.S. PATENT DOCUMENTS

| | | | |
|---|---|---|---|
| 6,002,700 A | 12/1999 | Sato | |
| 6,072,196 A | 6/2000 | Sato | |
| 6,201,264 B1 | 3/2001 | Khare et al. | |
| 6,207,973 B1 | 3/2001 | Sato et al. | |
| 6,542,528 B1 | 4/2003 | Sato et al. | |
| 6,563,851 B1 | 5/2003 | Jikutani et al. | |
| 6,614,821 B1 | 9/2003 | Jikutani et al. | |
| 6,674,777 B1 | 1/2004 | Nohava et al. | |
| 6,674,785 B2 | 1/2004 | Sato et al. | |
| 6,765,232 B2 | 7/2004 | Takahashi et al. | |
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 7,022,539 B2 | 4/2006 | Sato et al. | |
| 7,067,846 B2 | 6/2006 | Takahashi et al. | |
| 7,180,100 B2 | 2/2007 | Takahashi et al. | |
| 7,245,647 B2 | 7/2007 | Jikutani et al. | |
| 7,260,137 B2 | 8/2007 | Sato et al. | |
| 7,453,096 B2 | 11/2008 | Takahashi et al. | |
| 7,519,095 B2 | 4/2009 | Sato et al. | |
| 7,684,458 B2 | 3/2010 | Sato et al. | |
| 7,693,204 B2 | 4/2010 | Sato et al. | |
| 7,720,125 B2 | 5/2010 | Jikutani et al. | |
| 7,746,912 B2 | 6/2010 | Motomura et al. | |
| 7,940,827 B2 | 5/2011 | Sato et al. | |
| 8,385,381 B2 * | 2/2013 | Maeda et al. | 372/50.124 |
| 2002/0142506 A1 | 10/2002 | Sato | |
| 2003/0026308 A1 * | 2/2003 | Iwai et al. | 372/46 |
| 2006/0093010 A1 | 5/2006 | Sekiya et al. | |
| 2007/0014324 A1 | 1/2007 | Maeda et al. | |
| 2008/0055672 A1 | 3/2008 | Watanabe et al. | |
| 2008/0056321 A1 | 3/2008 | Motomura et al. | |
| 2008/0233017 A1 | 9/2008 | Sato et al. | |
| 2009/0091805 A1 | 4/2009 | Tanabe et al. | |
| 2009/0262770 A1 | 10/2009 | Itoh et al. | |
| 2009/0285252 A1 | 11/2009 | Ishii et al. | |
| 2009/0285602 A1 | 11/2009 | Harasaka et al. | |
| 2009/0286342 A1 | 11/2009 | Takahashi et al. | |
| 2009/0295902 A1 | 12/2009 | Sato et al. | |
| 2009/0303308 A1 | 12/2009 | Itoh et al. | |
| 2009/0310632 A1 | 12/2009 | Sugawara et al. | |
| 2010/0060712 A1 | 3/2010 | Sato et al. | |
| 2010/0189467 A1 | 7/2010 | Sato et al. | |
| 2010/0214633 A1 | 8/2010 | Sato et al. | |
| 2010/0311194 A1 | 12/2010 | Sasaki et al. | |
| 2011/0217077 A1 | 9/2011 | Harasaka et al. | |

FOREIGN PATENT DOCUMENTS

| | | |
|---|---|---|
| JP | 2001-156395 | 6/2001 |
| JP | 2001-284722 | 10/2001 |
| JP | 2003-115634 | 4/2003 |
| JP | 3566902 | 6/2004 |
| JP | 2004-535057 | 11/2004 |
| JP | 2006-100858 | 4/2006 |
| JP | 2006-210429 | 8/2006 |
| JP | 3928695 | 3/2007 |
| JP | 2007-173513 | 7/2007 |
| JP | 2007-201398 | 8/2007 |
| JP | 2008-60322 | 3/2008 |
| JP | 2009-206480 | 9/2009 |
| JP | 2010-153768 | 7/2010 |

OTHER PUBLICATIONS

Korean official action dated Apr. 30, 2013 and translation in corresponding Korean patent application.

* cited by examiner

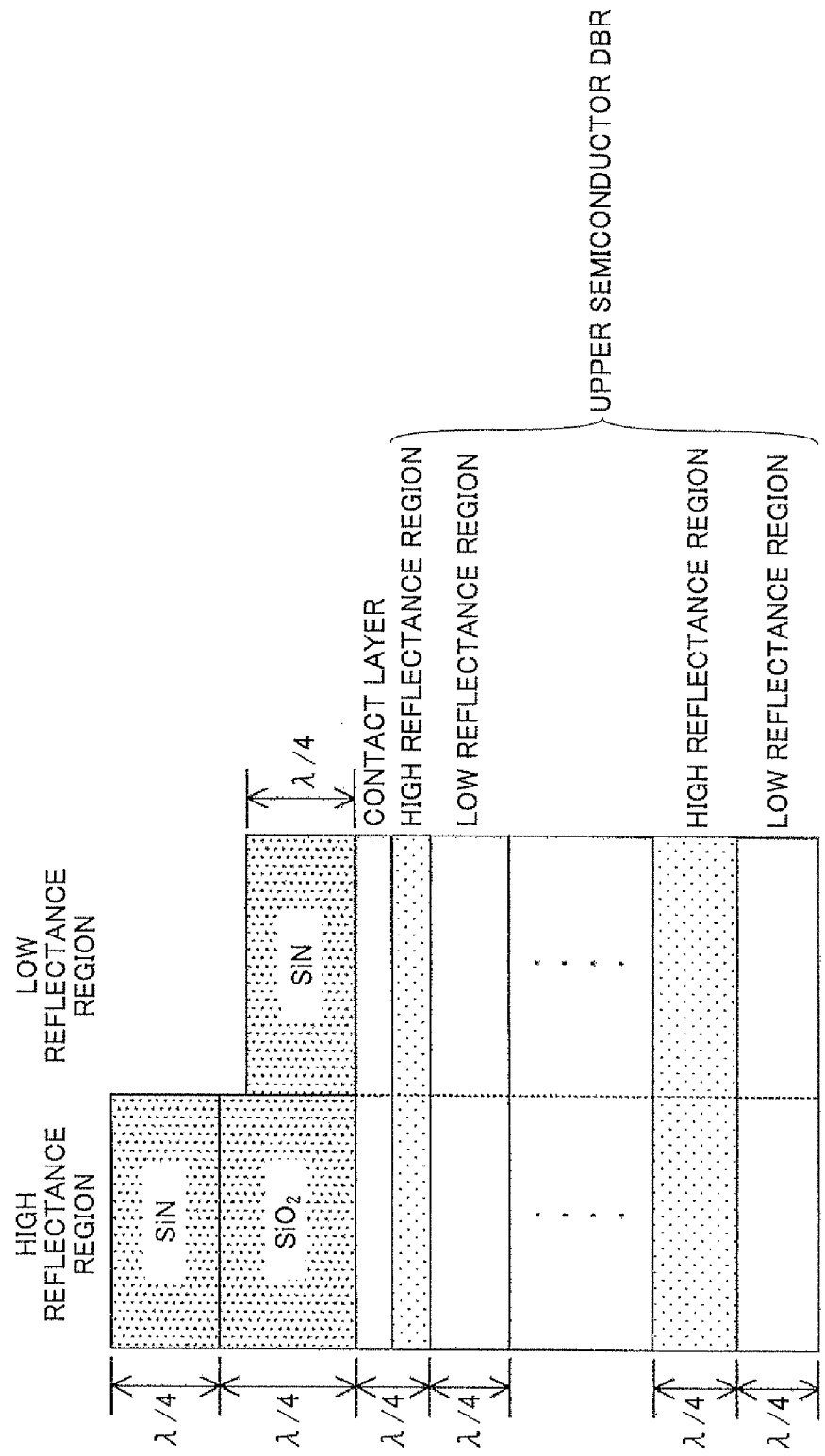

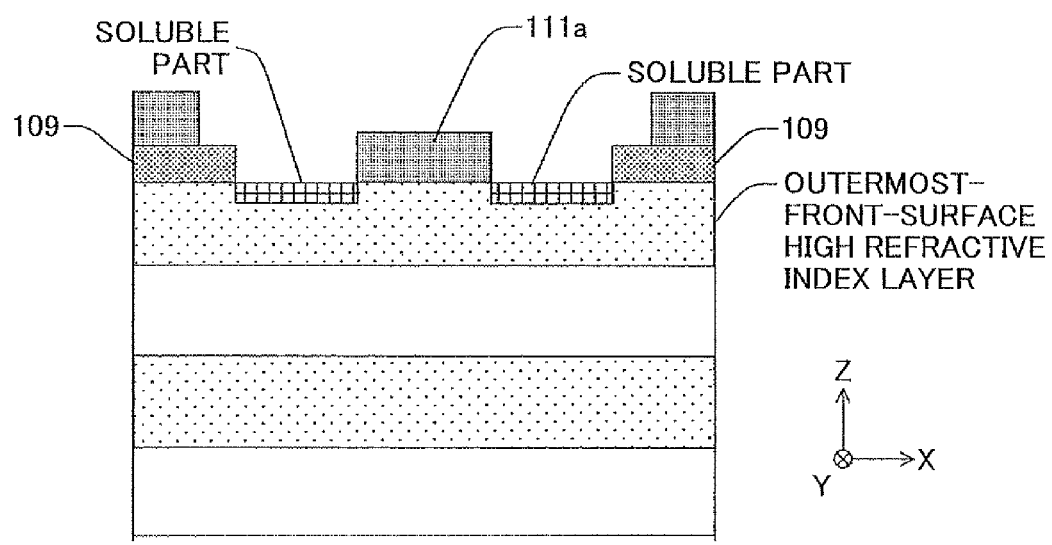
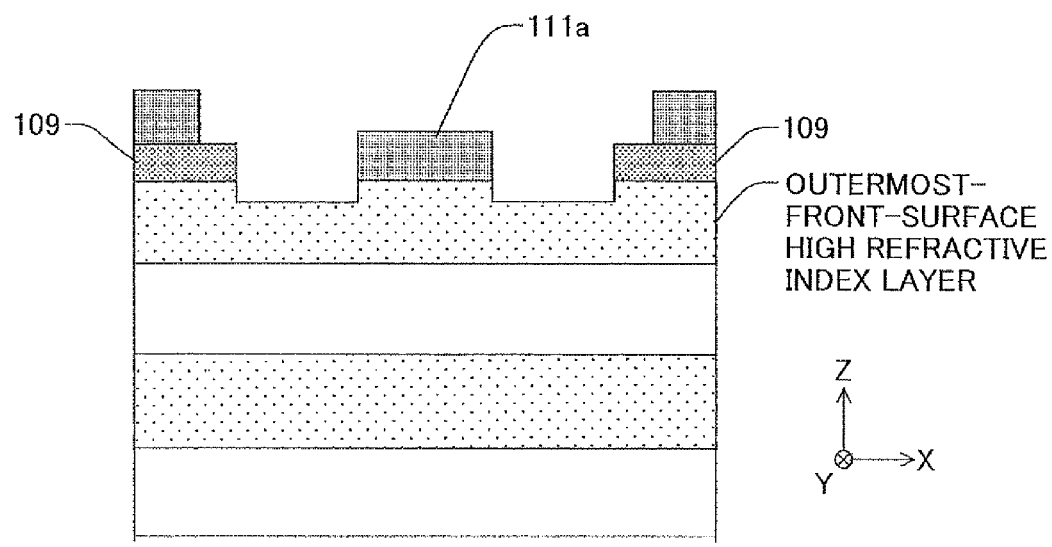

SURFACE-EMITTING LASER DEVICE, SURFACE-EMITTING LASER ARRAY, OPTICAL SCANNER, IMAGE FORMING APPARATUS, AND METHOD FOR MANUFACTURING SURFACE-EMITTING LASER DEVICE

TECHNICAL FIELD

The present invention relates to a surface-emitting laser device, a surface-emitting laser array, an optical scanner, an image forming apparatus, and a method for manufacturing the surface-emitting laser device. More specifically, the present invention relates to a surface-emitting laser device and a surface-emitting laser array that emit laser light in a direction perpendicular to the front surface of a substrate, an optical scanner having the surface-emitting laser device or the surface-emitting laser array, an image forming apparatus having the optical scanner, and a method for manufacturing the surface-emitting laser device that emits laser light in a direction perpendicular to the front surface of a substrate.

BACKGROUND ART

In a VCSEL (Vercial Cavity Surface Emitting Laser) device, it is important to suppress oscillations in a high-order side mode in terms of its application. Therefore, various attempts have been made to achieve this feature. Among them, it is particularly effective to make a reflectance difference between the central part and the peripheral part of an emitting region to suppress the oscillations in the high-order side mode. In this regard, various methods have been disclosed.

For example, Patent Document 1 discloses a surface-emitting laser device in which a layer structure made of a semiconductor material and having a luminous layer arranged between an upper reflecting mirror layer structure and a lower reflecting mirror layer structure is formed on a substrate. An upper electrode having a circular shape in a plan view is formed above the upper reflecting mirror layer structure. An opening part is formed inside the upper electrode and a transparent layer partially covering the front surface of the opening part is formed with respect to the oscillation wavelength of oscillation laser light. Here, a circular SiN film whose optical thickness is an odd number multiple of $\lambda/4$ is formed on an emitting surface, thereby reducing a reflectance in the peripheral part of an emitting region.

Further, Patent Document 2 discloses a surface-emitting semiconductor laser having a laser structure in which a first multilayer film reflecting mirror, an active layer having a luminous central region, a second multilayer film reflecting mirror, and a side mode control layer are laminated on a substrate in this order. In the laser structure, one of the first multilayer film reflecting mirror and the second multilayer film reflecting mirror has a quadrate current injection region in which the intersection point of diagonal lines corresponds to the luminous central region. The second multilayer film reflecting mirror has a light emitting port provided in a region corresponding to one of the diagonals in the current injection region and has a pair of groove parts provided on both sides of the light emitting port. The side mode control layer is provided corresponding to the light emitting port and structured such that the reflectance of a peripheral region other than a central region corresponding to the luminous central region in the light emitting port is lower than that of the central region. Here, as the side mode control layer, a structure in which plural types of dielectric films are alternately laminated with each other to make a reflectance difference is disclosed as well as a structure using one type of dielectric film (see, for example, a fifth embodiment of Patent Document 2). Moreover, the second multilayer film reflecting mirror in the peripheral region of the light emitting port is removed by etching to reduce the reflectance of the peripheral region (see, for example, a fourth embodiment of Patent Document 2).

Further, Patent Document 3 discloses a surface-emitting laser device having a layer structure in which a lower reflecting mirror, an active layer, and an upper reflecting mirror are laminated in this order, and has a current confinement layer provided inside the lower reflecting mirror or the upper reflecting mirror. This surface-emitting laser device has a semiconductor layer provided on the upper reflecting mirror and having a first region showing a first reflectance with respect to oscillation laser light and a second region showing a second reflectance with respect to the oscillation laser light inside the boundary surface of a current confinement region defined at least by the current confinement layer. Here, the thickness of a GaAs layer at the output surface is made different between a central part and a peripheral part by about $\lambda/4$ as an optical thickness, thereby reducing the reflectance of the peripheral part.

However, the surface-emitting semiconductor laser device disclosed in Patent Document 1 has a limit in the effect of suppressing the oscillations in the high-order side mode.

Further, in the surface-emitting semiconductor laser disclosed in Patent Document 2, the structure, in which the plural types of dielectric films are alternately laminated to form the side mode control layer, increases the number of processes of manufacturing the surface-emitting semiconductor layer, which is not desirable in terms of mass production and manufacturing cost.

Furthermore, in the surface-emitting semiconductor laser disclosed in Patent Document 2, when the second multilayer reflecting mirror in the peripheral region of the light emitting port is removed by etching, the multilayer reflecting mirror has a smaller reflectance than a dielectric per one pair. Therefore, in order to obtain a large reflectance difference, it is necessary to remove many layers. At this time, if the layers are removed by wet etching, it is presumed that the cross sections of the layers are inclined and the reflectance difference is likely to become unstable at a boundary between a high reflectance region and a low reflectance region.

Further, in the surface-emitting laser device disclosed in Patent Document 3, when the GaAs layer is increased to have an optical thickness of about $\lambda/4$ so as to make a large reflectance difference, an inconvenience such as a reduction in luminous efficiency due to an increased absorption loss occurs.

Patent Document 1: JP-A-2001-156395
Patent Document 2: JP-A-2007-201398
Patent Document 3: JP-A-2003-115634

DISCLOSURE OF INVENTION

The present invention has been made under such circumstances and may have a first aspect of providing a surface-emitting laser device and a surface-emitting laser array capable of suppressing oscillations in a high-order side mode without reducing a light output in a basic side mode.

Further, the present invention has a second aspect of providing an optical scanner capable of performing optical scanning with high precision.

Further, the present invention has a third aspect of providing an image forming apparatus capable of forming a high-quality image.

Further, the present invention may have a fourth aspect of providing a method for manufacturing the surface-emitting laser device capable of suppressing the oscillations in the high-order side mode without reducing the light output in the basic side mode.

According to the first aspect of the present invention, there is provided a surface-emitting laser device. The surface-emitting laser device includes a lower multilayer film reflecting mirror, a resonator structure having an active layer, an upper multilayer film reflecting mirror, a contact layer on which an electrode is provided, and a substrate on which the lower multilayer film reflecting mirror, the resonator structure, the upper multilayer film reflecting mirror, and the contact layer are laminated. A transparent dielectric layer is provided in an emitting region surrounded by an electrode and configured to cause a reflectance at a peripheral part to be different from a reflectance at a central part in the emitting region. The thickness of the contact layer is different between a region having a relatively high reflectance and a region having a relatively low reflectance in the emitting region. The contact layer is provided on a high refractive index layer of the upper multilayer film reflecting mirror, the total optical thickness of the high refractive index layer and the contact layer in the region having the relatively low reflectance is deviated from an odd number multiple of a one quarter oscillation wavelength of laser light emitted from the emitting region, and a reflectance difference between the region having the relatively high reflectance and the region having the relatively low reflectance is greater than a case in which the total optical thickness of the high refractive index layer and the contact layer is the odd number multiple of the one quarter oscillation wavelength.

According to the second aspect of the present invention, there is provided a surface-emitting laser device. The surface-emitting laser device includes a lower multilayer film reflecting mirror, a resonator structure having an active layer, an upper multilayer film reflecting mirror, a substrate on which the lower multilayer film reflecting mirror, the resonator structure, and the upper multilayer film reflecting mirror are laminated, and a transparent dielectric layer that is provided in an emitting region surrounded by an electrode and configured to cause a reflectance at a peripheral part to be different from a reflectance at a central part in the emitting region. The transparent dielectric layer is provided on a high refractive index layer of the upper multilayer film reflecting mirror, the thickness of the high refractive index layer is different between a region having a relatively high reflectance and a region having a relatively low reflectance in the emitting region, and the optical thickness of the high refractive index layer in the region having the relatively low reflectance is deviated from an odd number multiple of a one quarter oscillation wavelength of laser light emitted from the emitting region. A reflectance difference between the region having the relatively high reflectance and the region having the relatively low reflectance is greater than a case in which the optical thickness of the high refractive index layer is the odd number multiple of the one quarter oscillation wavelength.

BRIEF DESCRIPTION OF DRAWINGS

FIG. 9 is a view for explaining a model used for calculation;

FIG. 15 is a view for explaining a soluble part in an outermost-front-surface high refractive index layer;

FIG. 16 is a view for explaining a state in which the soluble part in the outermost-front-surface high refractive index layer is removed;

BEST MODE FOR CARRYING OUT THE INVENTION

Figure 1:
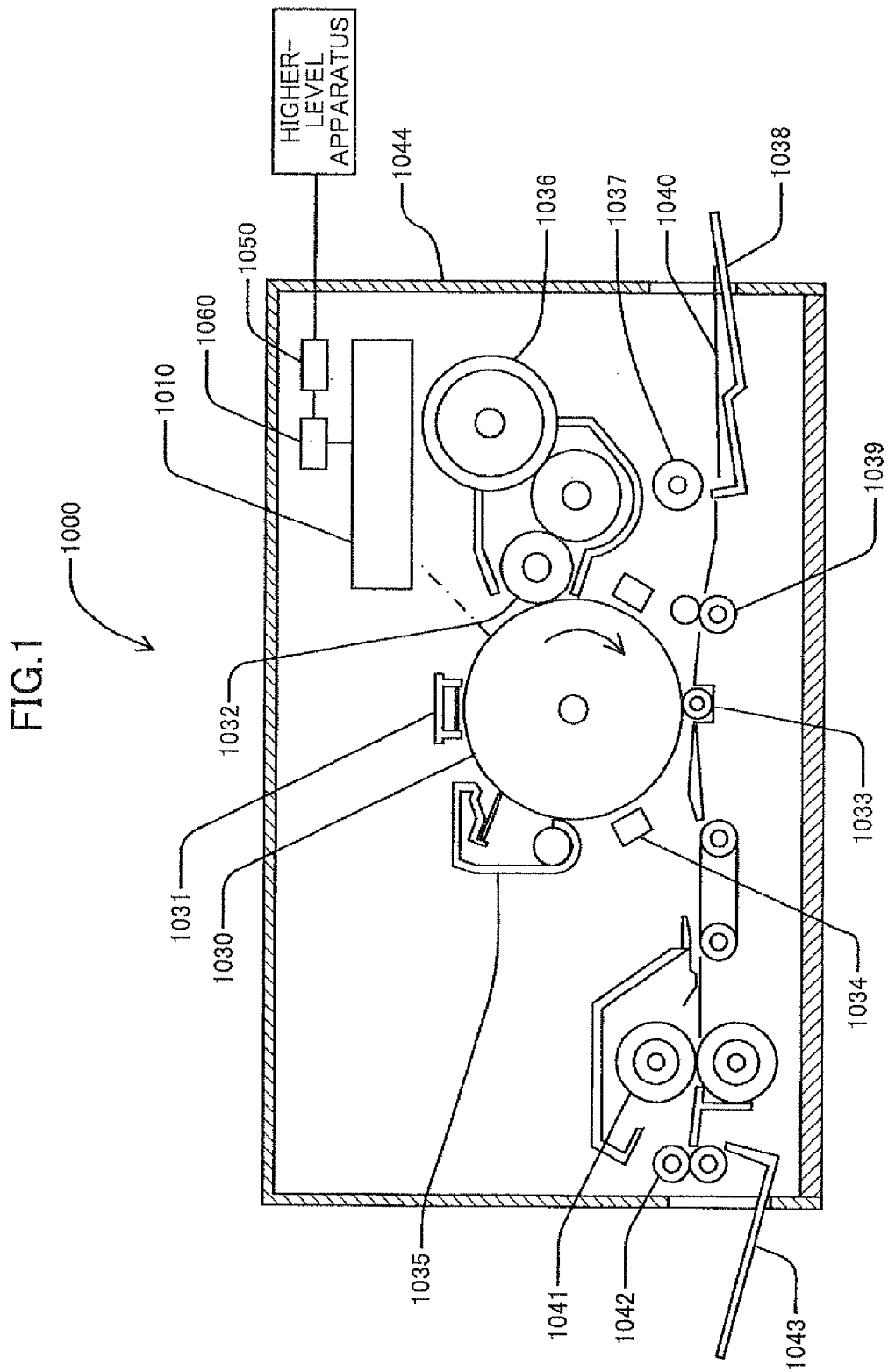
FIG. 1 is a view for explaining the schematic configuration of a laser printer according to an embodiment of the present invention.

Next, an embodiment of the present invention is described below with reference to FIGS. 1 through 32B. FIG. 1 shows the schematic configuration of a laser printer 1000 according to the embodiment.

The laser printer 1000 has an optical scanner 1010, a photosensitive drum 1030, an electrifying charger 1031, a developing roller 1032, a transfer charger 1033, a charge removing unit 1034, a cleaning unit 1035, a toner cartridge 1036, a sheet feeding roller 1037, a sheet feeding tray 1038, a pair of resist rollers 1039, a fixing roller 1041, a sheet discharging roller 1042, a sheet catching tray 1043, a communication control unit 1050, a printer control unit 1060 that collectively controls the above units, and the like. Note that these units are accommodated at predetermined positions in a printer housing 1044.

The communication control unit 1050 controls interactive communications with a higher-level apparatus (for example, a personal computer) via a network or the like.

The photosensitive drum 1030 is a cylindrical member having a photosensitive layer at its front surface. In other words, the front surface of the photosensitive drum 1030 is a surface to be scanned. The photosensitive drum 1030 rotates in the direction as indicated by an arrow in FIG. 1.

The electrifying charger 1031, the developing roller 1032, the transfer charger 1033, the charge removing unit 1034, and the cleaning unit 1035 are arranged near the front surface of the photosensitive drum 1030 and arranged in this order along the rotating direction of the photosensitive drum 1030.

The electrifying charger 1031 uniformly charges the front surface of the photosensitive drum 1030.

The optical scanner 1010 scans the front surface of the photosensitive drum 1030 charged by the electrifying charger 1031 with a light flux modulated in accordance with image information from the higher-level apparatus and forms a latent image corresponding to the image information on the front surface of the photosensitive drum 1030. The formed latent image moves in the direction of the developing roller 1032 along with the rotation of the photosensitive drum 1030. Note that the configuration of the optical scanner 1010 is described below.

The toner cartridge 1036 stores toner, which is supplied to the developing roller 1032.

The developing roller 1032 attaches the toner supplied from the toner cartridge 1036 to the latent image formed on the front surface of the photosensitive drum 1030 to form image information. The latent image, to which the toner (hereinafter referred also to as a "toner image" for convenience) is attached, moves in the direction of the transfer charger 1033 along with the rotation of the photosensitive drum 1030.

The sheet feeding tray 1038 stores recording sheets 1040. The sheet feeding roller 1037 is arranged near the sheet feeding tray 1038. The sheet feeding roller 1037 picks up the recording sheets 1040 one by one from the sheet feeding tray 1038 and conveys them to the pair of resist rollers 1039. The pair of resist rollers 1039 temporarily holds the recording sheet 1040 picked up by the sheet feeding roller 1037 while feeding the recording sheet 1040 to a gap between the photosensitive drum 1030 and the transfer charger 1033 along with the rotation of the photosensitive drum 1030.

In order to electrically attract the toner on the front surface of the photosensitive drum 1030 to the recording sheet 1040, a voltage having a polarity opposite to that of the toner is applied to the transfer charger 1033. With this voltage, the toner image on the front surface of the photosensitive drum 1030 is transferred to the recording sheet 1040. The recording sheet 1040 on which the toner image has been transferred is fed to the fixing roller 1041.

The fixing roller 1041 applies heat and pressure to the recording sheet 1040 to fix the toner onto the recording sheet 1040. The recording sheet 1040 onto which the toner has been fixed is fed to the sheet catching tray 1043 by the sheet discharging roller 1042 and stacked on the sheet catching tray 1043.

The charge removing unit 1034 removes the charge on the front surface of the photosensitive drum 1030.

The cleaning unit 1035 eliminates the toner (remaining toner) remaining on the front surface of the photosensitive drum 1030. The front surface of the photosensitive drum 1030, from which the remaining toner has been eliminated, returns to the position opposing the electrifying charger 1031 again.

Next, the configuration of the optical scanner 1010 is described.

Figure 2:
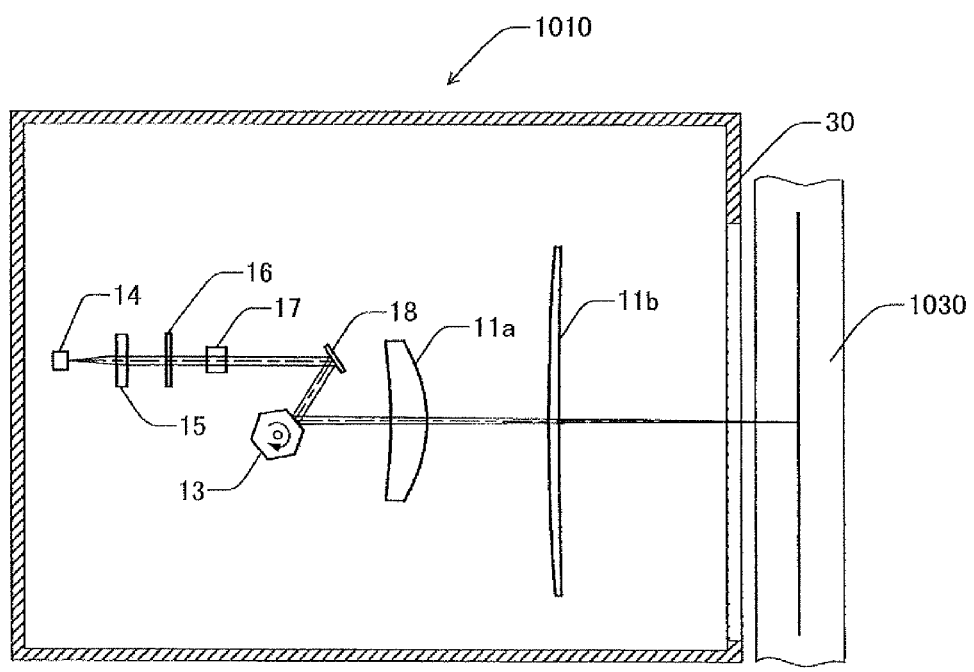
FIG. 2 is a view showing an optical scanner in FIG. 1.

As shown in FIG. 2 as an example, the optical scanner 1010 has a deflector-side scanning lens 11a, an image-surface-side scanning lens 11b, a polygon mirror 13, a light source 14, a coupling lens 15, an aperture plate 16, a cylindrical lens 17, a reflecting mirror 18, a scanning control unit (not shown), and the like. These components are assembled at predetermined positions in an optical housing 30.

Note that in the following description, a direction corresponding to a main scanning direction is briefly described as a "main-scanning corresponding direction," and a direction corresponding to a sub-scanning direction is briefly described as a "sub-scanning corresponding direction" for convenience.

The coupling lens 15 converts light flux output from the light source 14 into substantially parallel light.

The aperture plate 16 has an aperture part, which defines the light diameter of the light flux through the coupling lens 15.

The cylindrical lens 17 forms the image of the light flux, which has passed through the aperture part of the aperture plate 16, near the deflecting and reflecting surface of the polygon mirror 13 through the reflecting mirror 18 in the sub-scanning corresponding direction.

An optical system arranged on a light path between the light source 14 and the polygon mirror 13 is also called a pre-deflector optical system. In this embodiment, the pre-deflector optical system is composed of the coupling lens 15, the aperture plate 16, the cylindrical lens 17, and the reflecting mirror 18.

The polygon mirror 13 is formed of a short hexagonal member, the side of which has six deflecting and reflecting surfaces. The polygon mirror 13 deflects the light flux from the reflecting mirror 18 while rotating about a shaft parallel to the sub-scanning corresponding direction at a constant speed.

The deflector-side scanning lens 11a is arranged on the light path of the light flux deflected by the polygon mirror 13.

The image-surface-side scanning lens 11b is arranged on the light path of the light flux through the deflector-side scanning lens 11a. The light flux through the image-surface-side scanning lens 11b is applied to the front surface of the photosensitive drum 1030 to form a light spot. The light spot moves in the longitudinal direction of the photosensitive drum 1030 along with the rotation of the polygon mirror 13. In other words, the light spot scans the front surface of the photosensitive drum 1030. The movement direction of the light spot at this time is the "main scanning direction." Further, the rotating direction of the photosensitive drum 1030 is the "sub-scanning direction."

An optical system arranged on the light path between the polygon mirror 13 and the photosensitive drum 1030 is also called a scanning optical system. In this embodiment, the scanning optical system is composed of the deflector-side scanning lens 11*a* and the image-surface-side scanning lens 11*b*. Note that at least one turning-back mirror may be arranged on at least one of the light path between the deflector-side scanning lens 11*a* and the image-surface-side scanning lens 11*b* and the light path between the image-surface-side scanning lens 11*b* and the photosensitive drum 1030.

The light source 14 has a surface-emitting laser device that emits light in a direction orthogonal to the front surface of a substrate. The surface-emitting laser device may be configured in various ways. Accordingly, some configuration examples are described below. Note that in this specification, a laser oscillating direction is defined as a Z-axis direction, and two directions orthogonal to each other in a plane perpendicular to the Z-axis direction are defined as an X-axis direction and a Y-axis direction, respectively.

First Configuration Example

Figure 3A:
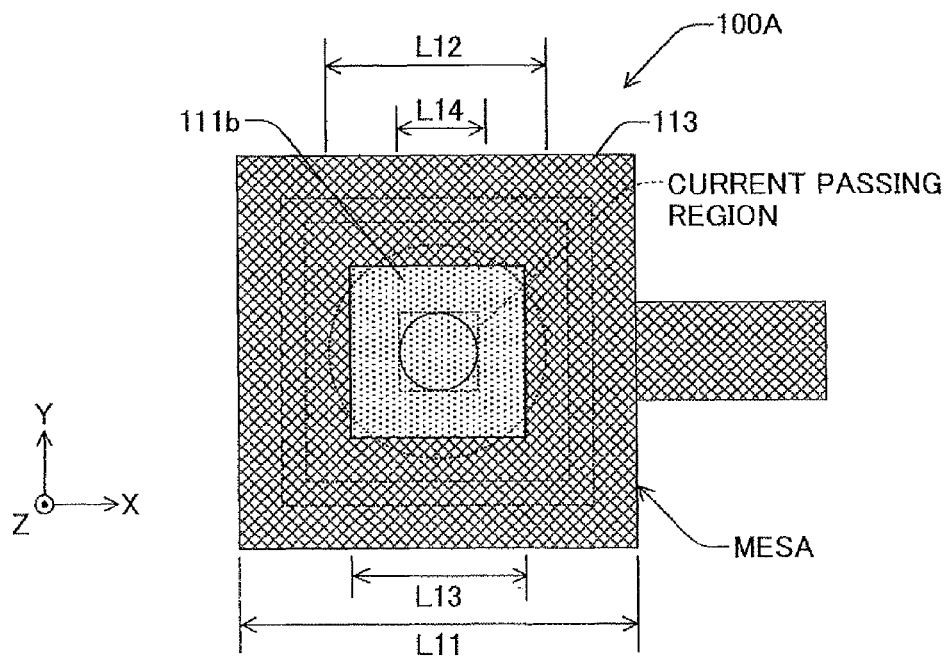
FIGS. 3A and 3B are views for explaining a surface-emitting laser device 100 according to a first configuration example.
Figure 3B:
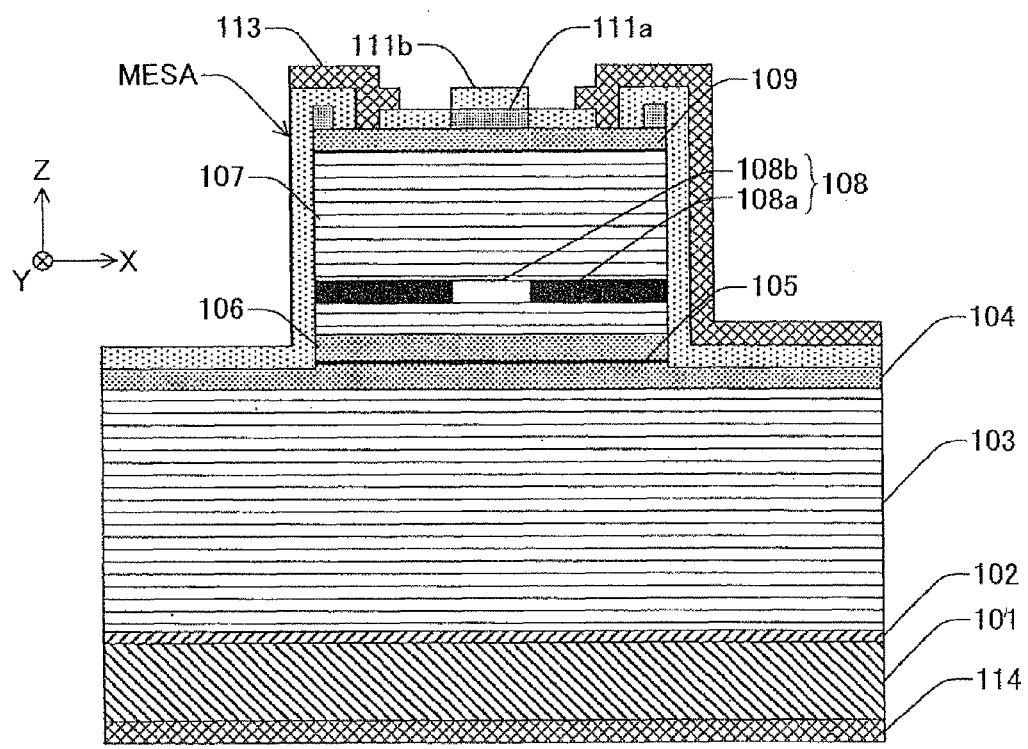
Figure 4:
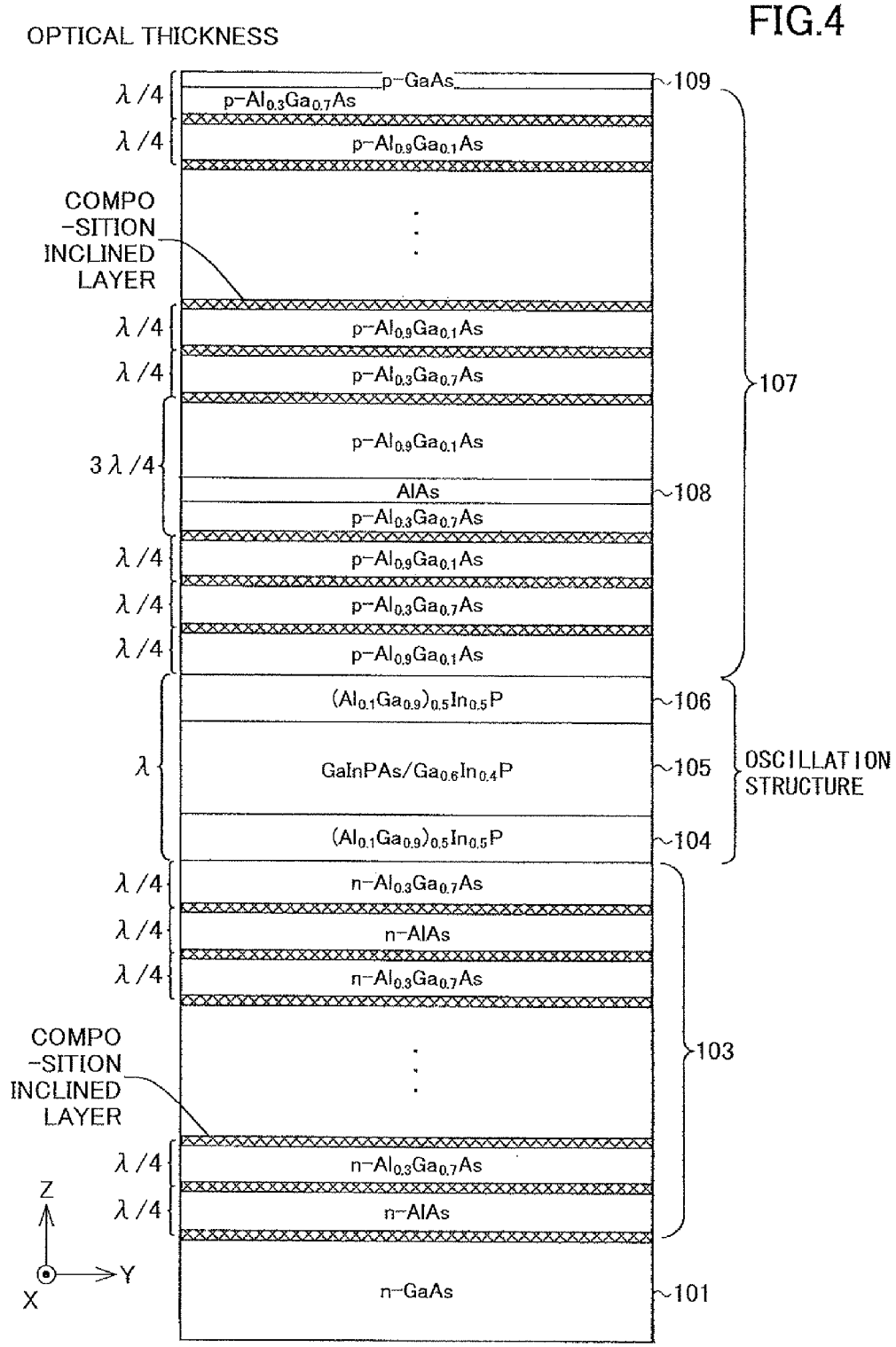
FIG. 4 is a view for explaining a laminated body.

A surface-emitting laser device 100A according to a first configuration example is shown in FIGS. 3A, 3B, and 4. FIG. 3A is a plan view near an emitting part in the surface-emitting laser device 100A, and FIG. 3B is a cross-sectional view taken parallel along an X-Z plane in the surface-emitting laser device 100A. Note that in FIG. 3A, symbol L11 represents a length of about 25 μm, symbol L12 represents a length of about 15 μm, L13 represents a length of about 13 μm, and symbol L14 represents a length of about 5 μm.

The surface-emitting laser device 100A has an oscillation wavelength of a 780 nm band, and has a substrate 101, a buffer layer 102 (not shown in FIG. 4), a lower semiconductor DBR 103, a lower spacer layer 104, an active layer 105, an upper spacer layer 106, an upper semiconductor DBR 107, a contact layer 109, and the like.

Figure 5A:
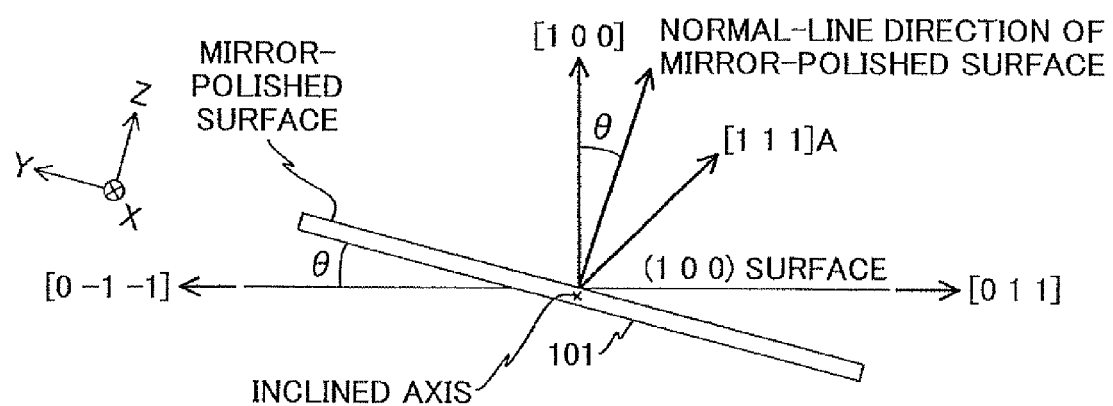
FIGS. 5A and 5B are views for explaining the substrate of the surface-emitting laser device 100A.
Figure 5B:
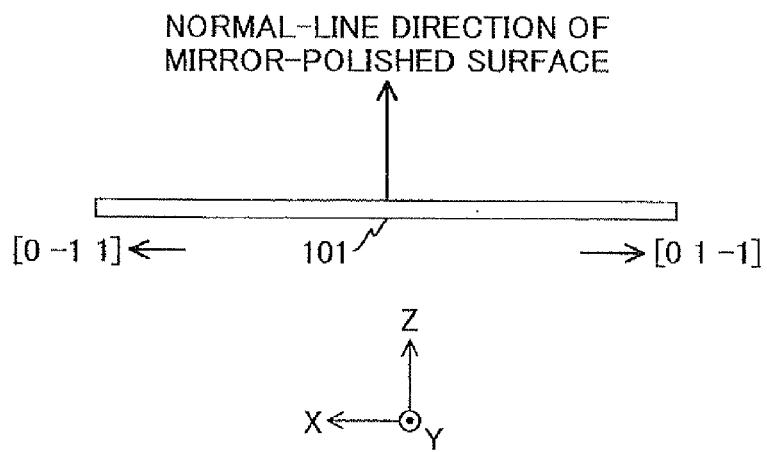
Figure 6:
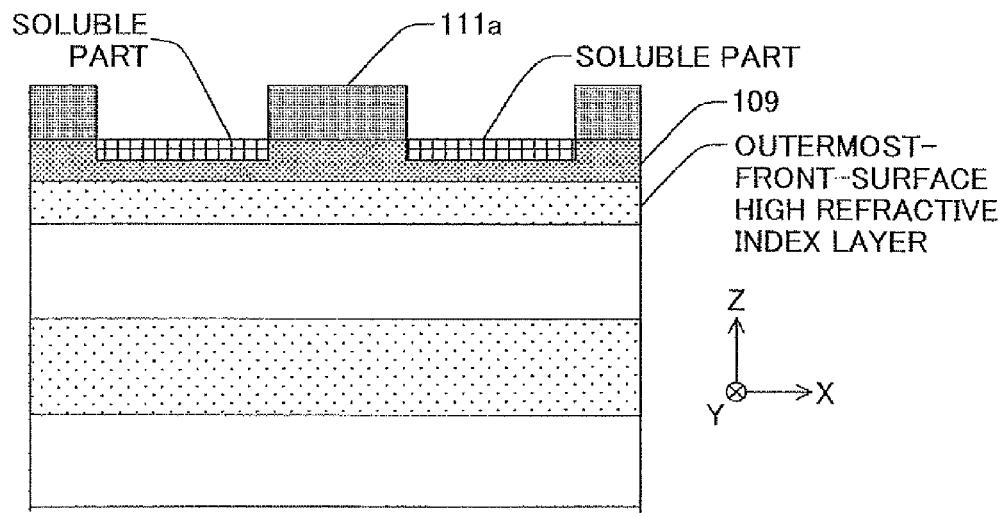
FIG. 6 is a view for explaining a soluble part in a contact layer.
Figure 7:
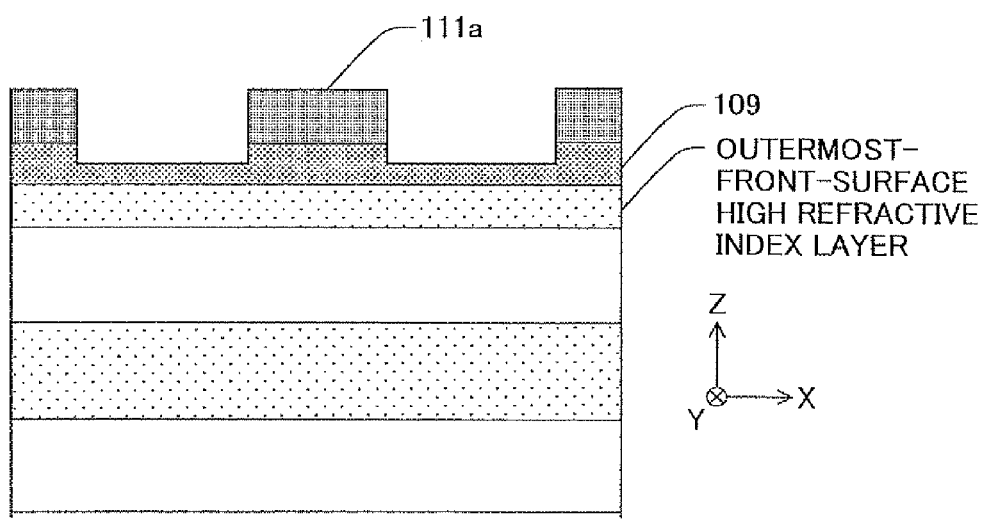
FIG. 7 is a view for explaining a state in which the soluble part in the contact layer is removed.

The substrate 101 has a mirror-polished surface as its front surface. As shown in FIG. 5A, the substrate 101 is an n-GaAs single-crystal substrate in which the normal-line direction of the mirror-polished surface (main surface) is inclined by 15 degrees (θ=15 degrees) toward a crystal orientation [1 1 1] A direction relative to a crystal orientation [1 0 0] direction. In other words, the substrate 101 is a so-called inclined substrate. Here, as shown in FIG. 5B, the normal-line direction of the mirror-polished surface is arranged such that a crystal orientation [0 −1 1] direction is defined as a positive X-direction, and a crystal orientation [0 1 −1] direction is defined as a negative X-direction. Further, the inclined substrate works to stabilize a polarization direction in an inclined axis direction (here, the X-axis direction).

Referring back to FIG. 3B, the buffer layer 102 is laminated on the surface of the positive Z-side of the substrate 101 and made of N—GaAs.

The lower semiconductor DBR 103 is laminated on the surface of the positive Z-side of the buffer layer 102 and has 40.5 pairs of low refractive-index layers made of n-AlAs and high refractive-index layers made of n-$Al_{0.3}Ga_{0.7}As$. In order to reduce electric resistance, a composition inclined layer (not shown in FIG. 3B, see FIG. 4) having a thickness of 20 nm, in which compositions are gradually changed from one to the other, is provided between the respective refractive-index layers. Each of the refractive-index layers is set in such a manner as to have an optical thickness of $\lambda/4$ including ½ of the neighboring composition inclined layer assuming that an oscillating wavelength is $\lambda$. Note that when the optical thickness is $\lambda/4$, the actual thickness D of the layer is expressed by D=$\lambda/4n$ (where n is the refractive index of the medium of the layer).

The lower spacer layer 104 is laminated on the positive Z-side of the lower semiconductor DBR 103 and made of non-doped $(Al_{0.1}Ga_{0.9})_{0.5}In_{0.5}P$.

The active layer 105 is laminated on the positive Z-side of the lower spacer layer 104 and has a three quantum well layers and four barrier layers. Each of the quantum well layers is made of GaInAsP as a composition inducing a compression distortion of 0.7% and has a band gap wavelength of about 780 nm. Further, each of the barrier layers is made of GaInP as a composition inducing a tensile distortion of 0.6%.

The upper spacer layer 106 is laminated on the positive Z-side of the active layer 105 and made of non-doped $(Al_{0.1}Ga_{0.9})_{0.5}In_{0.5}P$.

A part composed of the lower spacer layer 104, the active layer 105, and the upper spacer layer 106 is also called a resonator structure and set in such a manner as to have an optical thickness of one wavelength. Note that the active layer 105 is provided at the center of the resonator structure, which corresponds to the antinode of a stationary wave distribution in an electric field, so as to obtain a high stimulated emitting probability.

The upper semiconductor DBR 107 is laminated on the positive Z-side of the upper spacer layer 106 and has 24 pairs of low refractive-index layers made of p-$Al_{0.9}Ga_{0.1}As$ and high refractive-index layers made of p-$Al_{0.3}Ga_{0.7}As$. A composition inclined layer (not shown in FIG. 3B, see FIG. 4), in which compositions are changed form one to the other, is provided between the respective refractive-index layers so as to reduce electric resistance. Each of the refractive-index layers is set in such a manner as to have an optical thickness of $\lambda/4$ including ½ of the neighboring composition inclined layer.

In one of the low-refractive index layers of the upper semiconductor DBR 107, a selectively oxidized layer that is made of p-AlAs and has a thickness of 30 nm is inserted. The selectively oxidized layer is inserted into a position corresponding to the third section from the active layer in the statutory wave distribution in the electric field.

The contact layer 109 is laminated on the positive Z-side of the upper semiconductor DBR 107 and is a layer having a film thickness of 25 nm and made of p-GaAs. The contact layer 109 is a layer that has increased doping concentration so as to bond semiconductors to electrodes with small resistance. For example, the contact layer 109 is one obtained by doping Zn into GaAs.

Further, the refractive index layer on the outermost positive Z-side in the upper semiconductor DBR 107 is a high refractive index layer (hereinafter referred also to as an "outermost-front-surface high refractive index layer" for conveniences sake). The composition inclined layer is provided between the outermost-front-surface high refractive index layer and a low refractive index layer serving as the under layer (the refractive index layer on the negative Z-side) of the outermost-front-surface high refractive index layer, and is designed such that an optical thickness from the center of the composition inclined layer to the front surface of the contact layer 109 becomes $\lambda/4$ (see FIG. 4 for the composition inclined layer).

In the following description, one having the plural semiconductor layers laminated on the substrate 101 as described above is called a "laminated body" for convenience.

Next, a method for manufacturing the surface-emitting laser device 100A is described.

(A1) The laminated body is formed by crystal growth using a metal organic chemical vapor deposition method (MOCVD method) or a molecular beam epitaxial growing method (MBE method).

Here, trimethyl aluminum (TMA), trimethyl gallium (TMG), and trimethyl indium (TMI) are used as group III materials, and phosphine ($PH_3$) and arsin ($AsH_3$) are used as group V materials. Further, carbon tetrabromide ($CBr_4$) and dimethyl zinc (DMZn) are used as p-type dopant materials, and hydrogen selenide ($H_2Se$) is used as an n-type dopant material.

(A2) On the front surface of the laminated body, a first dielectric layer 111a made of $SiO_2$ is formed by a chemical vapor deposition method (CVD method). Here, the first dielectric layer 111a is set to have an optical thickness of $\lambda/4$. Specifically, since $SiO_2$ has a refractive index n of 1.45 and an oscillation wavelength $\lambda$ of 780 nm, an actual film thickness ($=\lambda/4n$) is set to be about 134 nm.

(A3) An etching mask is formed that includes a resist pattern (called a first pattern) for masking a region corresponding to a part having a high reflectance in an emitting region and a resist pattern (called a second pattern) for defining the outer shape of a mesa structure (hereinafter abbreviated as a "mesa" for convenience). Here, the first pattern is a doughnut-shaped pattern having an inner diameter L14 (here about 5 μm) and an outer diameter L12 (here about 15 μm). Further, the second pattern forms a square shape as its outer shape having a length of L11 (here about 25 μm), and is a closed pattern having a width of about 2 μm.

(A4) The dielectric layer 111a is etched by wet etching using buffered hydrofluoric acid (BHF). Thus, the dielectric layer 111a corresponding to a part that is not masked by the etching mask is removed.

(A5) A resist pattern that covers a region surrounded by the second pattern is formed.

(A6) The laminated body is etched by an ECR etching method using $Cl_2$ gas to form a quadrangular-column-shaped mesa having at least a selective oxidized layer 108 exposed at its side surface. Here, etching is performed down to a lower spacer layer.

(A7) The respective resist patterns are removed.

(A8) The laminated body is heat-treated in water vapor. Thus, Al (aluminum) of the selective oxidized layer 108 is selectively oxidized from the peripheral part of the mesa. Then, a non-oxidized region 108b surrounded by an oxide 108a of Al is caused to remain at the center of the mesa. That is, an oxidized confinement structure is formed that allows the driving current of a light-emitting part to be supplied only at the center of the mesa. The non-oxidized region 108b is a current passing region. Thus, the substantially-square-shaped current passing region having a width of, for example, 4 through 6 μm is formed. Further, at the same time, the front surface of the exposed part of the contact layer 109 is oxidized to form a soluble part soluble in acid and an alkali solution (see FIG. 6). Here, the soluble part has a depth of about 15 nm.

(A9) The laminated body is immersed in ammonia water for 40 seconds. Thus, the soluble part of the contact layer 109 is removed (see FIG. 7). Note that the ammonia water is used here to remove the soluble part, but acid and other alkali solutions may be used. For example, a hydrochloric acid solution, a phosphoric acid solution, an alkali developing solution, or the like may be used.

(A10) A second dielectric layer 111b made of SiN is formed by a chemical vapor deposition method (CVD method). Here, the second dielectric layer 111b is set to have an optical thickness of $\lambda/4$. Specifically, since SiN has a refractive index n of 1.87 and an oscillation wavelength $\lambda$ of 780 nm, an actual film thickness ($=\lambda/4n$) is set to be about 105 nm.

(A11) An etching mask for exposing the contact layer corresponding to a part (contact hole) in contact with a p-side electrode is formed on the mesa serving as the emitting surface of laser light.

The second dielectric layer 111b is etched by wet etching using BHF to form a contact hole.

(A13) The etching mask is removed (A13).

(A14) A square-shaped resist pattern having a side of L13 (here about 13 μm) is formed in a region serving as a light emitting part on the upper part of the mesa, and a p-side electrode material is deposited. A multilayer film made of Cr/AuZn/Au or one made of Ti/Pt/Au is used as the p-side electrode material.

(A15) The electrode material deposited in the region serving as the light emitting part is lifted off to form the p-side electrode 113. A region surrounded by the p-side electrode 113 is the emitting region. The emitting region is a square shape having a side of L13.

(A16) After the rear side of the substrate 101 is polished by a predetermined thickness (for example, about 100 μm), an n-side electrode 114 is formed. Here, the n-side electrode 114 is a multilayer film made of AuGe/Ni/Au.

(A17) Ohmic conduction between the p-side electrode 113 and the n-side electrode 114 is obtained by annealing. Thus, the mesa is converted into the light-emitting part.

(A18) Each chip is cut out.

After being subjected to various subsequent processes, the surface-emitting laser device 100A is manufactured.

In the surface-emitting laser device 100A thus manufactured, the second dielectric layer 111b having an optical thickness of $\lambda/4$ is provided at the peripheral part of the emitting region, and a dielectric layer composed of the first dielectric layer 111a having an optical thickness of $\lambda/4$ and the second dielectric layer 111b having an optical thickness of $\lambda/4$ are provided at the central part of the emitting region.

Figure 8:
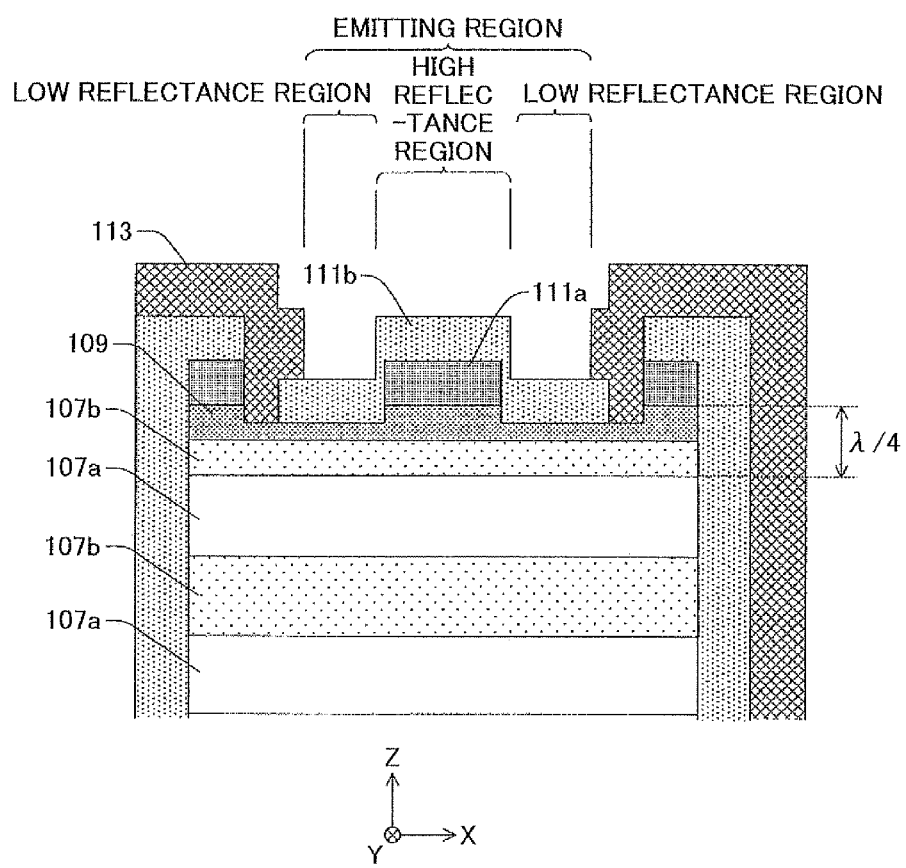
FIG. 8 is a partially-enlarged view of the surface-emitting laser device 100A in FIG. 3B.

In this case, the peripheral part of the emitting region becomes a region having a relatively low reflectance (low reflectance region), and the central part of the emitting region becomes a region having a relatively high reflectance (high reflectance region) (see FIG. 8). Note that symbol 107a in FIG. 8 represents a low refractive index layer in the upper semiconductor DBR 107 and symbol 107b represents a high refractive index layer in the upper semiconductor DBR 107. Further, in FIG. 8, the composition inclined layer is omitted.

Further, in the surface-emitting laser device 100A, the contact layer 109 has a thickness of 25 nm in the high reflectance region and a thickness of 10 nm (=25−15) in the low reflectance region. That is, the thickness of the contact layer 109 is different between the low reflectance region and the high reflectance region in the emitting region.

In the high reflectance region, the total optical thickness of the contact layer 109 and the outermost-front-surface high refractive index layer (including ½ of the composition inclined layer) is $\lambda/4$. In the low reflectance region, the total optical thickness of the contact layer 109 and the outermost-front-surface high refractive index layer (including ½ of the composition inclined layer) is smaller than $\lambda/4$. The outermost-front-surface high refractive index layer is a high refractive index layer 107b at a top part on a positive Z-side in FIG. 8.

That is, in the surface-emitting laser device 100A, the dielectric layers are provided in each of the high reflectance region and the low reflectance region, the thickness of the contact layer 109 in the high reflectance region is different from that of the contact layer 109 in the low reflectance region, and the total optical thickness of the outermost-front-surface high refractive index layer (including ½ of the composition inclined layer) and the contact layer 109 in the low reflectance region is deviated from λ/4.

In this case, a reflectance difference between the low reflectance region and the high reflectance region can be increased more than ever before. As a result, a greater oscillation suppressing effect can be obtained in a high-order side mode.

Regarding the surface-emitting laser device 100A, a light output (basic side mode output) having a SMSR (Side Mode Suppression Ratio) of 20 dB in the high-order side mode relative to a basic side mode was evaluated. Generally, an increase in the area of a current passing region easily causes oscillations in the high-order side mode in which a light output has a peak at the peripheral part of an emitting region. Therefore, an output in the basic side mode is likely to be reduced. However, in the surface-emitting laser device 100A, even if the area of the current passing region is 30 λm$^2$, an output of 2.5 mW or more was obtained in the basic side mode.

Each of the dielectric layer 111a and the dielectric layer 111b has an optical thickness of λ/4. Further, the dielectric layer 111a has a smaller refractive index than that of the dielectric layer 111b.

In this case, the dielectric layer 111a and the dielectric layer 111b form a pair of dielectric multilayer film reflecting mirrors at the central part of the emitting region, which in turn increases a reflectance. Conversely, reflected waves having an opposite phase are generated at a boundary between the dielectric layer 111b and air at the peripheral part of the emitting region, which in turn reduces a reflectance.

Light intensity in the basic side mode tends to increase at the central part of the emitting region and reduced toward the peripheral part. Conversely, light intensity in the high-order side mode tends to increase at least at the peripheral part of the emitting region. In the surface-emitting laser device 100A, a reflectance increases at the central part of the emitting region, while reducing at the peripheral part thereof. Therefore, only oscillations in the high-order side mode are suppressed without reducing an output in the basic mode.

Further, the total optical thickness of the outermost-front-surface high refractive index layer (including ½ of the composition inclined layer) and the contact layer 109 in the low reflectance region is deviated from λ/4. In this case, a reflectance in the low reflectance region reduces because a phase with respect to stationary waves is deviated in the contact layer 109. As a result, a reflectance difference between the central part and the peripheral part is further increased, which in turn further improves the oscillation suppressing effect in the high-order side mode.

Since the contact layer is a layer bonded to metal wiring, it has great doping concentration and causes an absorption loss with respect to laser light. That is, the thickness of the contact layer is proportional to the absorption loss and has an effect on reflectance. On the other hand, since the dielectric layer and the multilayer film reflecting mirror do not absorb light, their thicknesses do not have an effect on reflectance.

Further, if the film thickness is deviated from λ/4 as an optical length with respect to laser light, a reflectance changes. For example, in a case where layers are alternately provided in the order from the layer having a high refractive index, the layer having a low refractive index, and the layer having a high refractive index, a reflectance becomes maximum if the optical length of the film thickness is λ/4 and reduces if it is deviated from λ/4. Further, in a case where layers are not alternately provided in the order from the layer having a high refractive index, the layer having a low refractive index, and the layer having a low refractive index, the reflectance becomes minimum if the optical length of the film thickness is λ/4 and increases if it is deviated from λ/4.

In the configuration example of the specification of the present invention, the film thicknesses of the contact layer and the outermost-front-surface layer of the multilayer reflecting mirror are controlled to make a reflectance difference in the emitting region.

Here, prior to selectively oxidizing the selective oxidized layer 108 to form an oxidized confinement structure, the contact layer 109 corresponding to the low reflectance region is exposed. Further, while forming the oxidized confinement structure, the front surface of the contact layer 109 corresponding to the low reflectance region is oxidized. If the contact layer 109 is oxidized at its front surface, oxides are removed from the contact layer 109 by acid and alkali and the contact layer 109 is easily thinned. In view of this, the contact layer 109 having its front surface oxidized is immersed in ammonia water to thin the contact layer 109 corresponding to the low reflectance region. Thus, the total optical thickness of the outermost-front-surface high refractive index layer (including ½ of the composition inclined layer) and the contact layer 109 in the low reflectance region is set to be smaller than λ/4.

In order to confirm the effect of deviating from λ/4 the total optical thickness of the outermost-front-surface high refractive index layer (including ½ of the composition inclined layer) and the contact layer in the low reflectance region, a reflectance was calculated using a one-dimensional calculation model shown in FIG. 9. In this calculation model, 23 pairs of $Al_{0.3}Ga_{0.7}As$ and $Al_{0.9}Ga_{0.1}As$ each having an optical thickness of λ/4 are laminated as the upper semiconductor DBR, and the contact layer is formed on a high refractive index layer closest to an emitting surface. Further, a pair of dielectric multilayer reflecting mirrors having an optical thickness of λ/4 and made of $SiO_2$ (n=1.45) and SiN (n=1.87) are formed on the front surface of the contact layer in the high reflectance region, and the dielectric layer having an optical thickness of λ/4 and made of SiN is formed on the front surface of the contact layer. Moreover, if the thickness of the contact layer is 25 nm, the total optical thickness of the outermost-front-surface high refractive index layer and the contact layer in the upper semiconductor DBR is set to be λ/4.

Figure 10A:
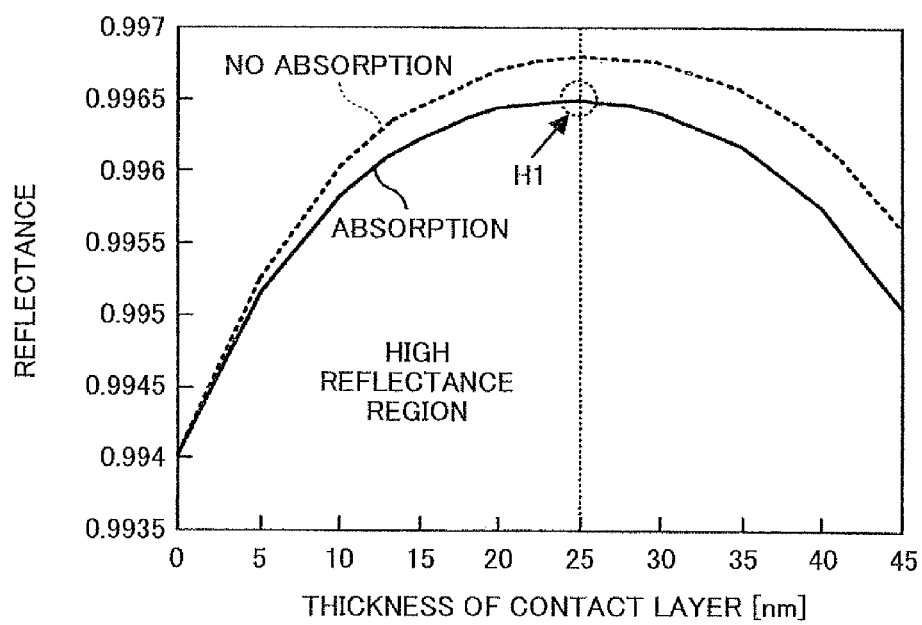
FIGS. 10A and 10B are graphs for explaining calculation results.
Figure 10B:
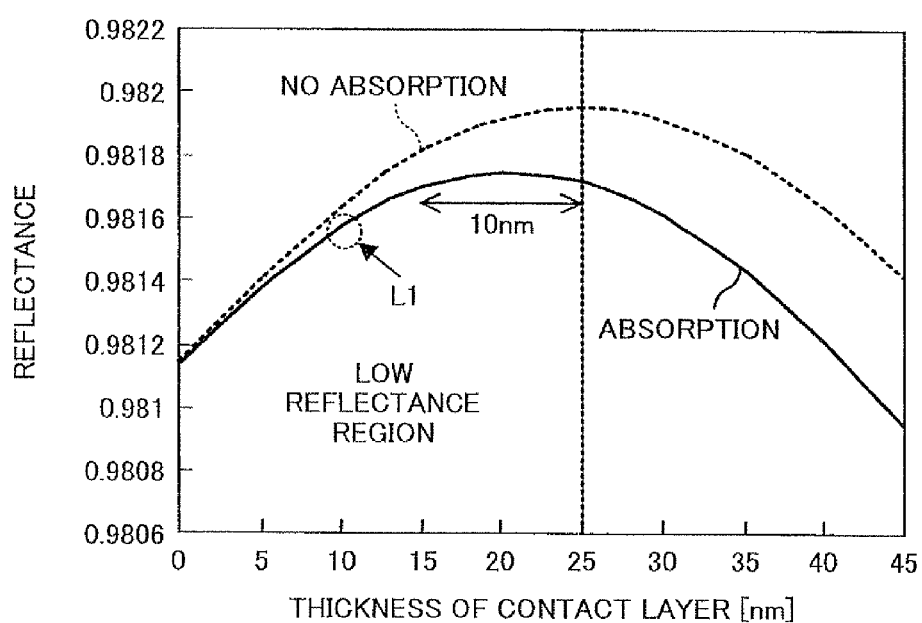

In this calculation model, FIGS. 10A and 10B show the calculation results of a reflectance in the high reflectance region and the low reflectance region, respectively, where only the thickness of the contact layer is changed.

In FIGS. 10A and 10B, solid lines indicate the calculation results where the absorption coefficient of the contact layer is set to be 10000 [cm$^{-1}$], and broken lines indicate the calculation results where the absorption coefficient of the contact layer is set to be zero for comparison. Since the absorption coefficient of GaAs is about 10000 [cm$^{-1}$] at a waveband of 780 nm, the results indicated by the solid lines are values closer to actual values.

As shown in FIG. 10A, regardless of the presence or absence of absorption, there is a tendency that the reflectance becomes maximum when the thickness of the contact layer approximates 25 nm and reduces when the thickness of the contact layer is deviated from 25 nm in the high reflectance region. This is because the total optical thickness of the outermost-front-surface high refractive index layer and the contact layer is deviated from λ/4.

As shown in FIG. 10B, if the absorption coefficient is zero, there is a tendency that the reflectance becomes maximum when the thickness of the contact layer approximates 25 nm and reduces when the thickness of the contact layer is deviated from 25 nm in the low reflectance region. As opposed to this, if the absorption occurs, there is a tendency that the reflectance becomes maximum when the thickness of the contact layer is smaller than 25 nm and approximates 20 nm and reduces when the thickness of the contact layer is deviated from 20 nm.

As described above, the reflectance becomes maximum when the thickness of the contact layer is 20 nm rather than being 25 nm. This is because the reflectance reduces since the total optical thickness of the outermost-front-surface high refractive index layer and the contact layer is deviated from λ/4 when the thickness of the contact layer is 20 nm but increases due to a reduction in absorption loss when the thickness of the contact layer is smaller than 25 nm.

The reason why the tendencies are different depending on the values of the absorption coefficients between the high reflectance region and the low reflectance region is that the influences of the absorption by the contact layer are likely to emerge in the low reflectance region because the reflectance in the low reflectance region is relatively small.

Accordingly, as compared with a case in which the thickness of the contact layer is 25 nm in the low reflectance region, it is found that a greater reflectance difference can be obtained if the thickness of the contact layer approximates 25 nm in the high reflectance region and the thickness of the contact layer is greater than 25 nm or smaller than 25 nm by 10 nm or more in the low reflectance region.

For example, if the contact layer in the low reflectance region is thinned by 15 nm, the thickness of the contact layer in the low reflectance region is 10 nm. At this time, the high reflectance region corresponds to a position H1 in FIG. 10A, and the low reflectance region corresponds to a position L1 in FIG. 10B. Assuming that the reflectance at the position H1 is $R_{H1}$ and the reflectance at the position L1 is $R_{L1}$, the reflectance difference is $R_{H1}-R_{L1}$. This reflectance difference is greater than a case in which the total optical thickness of the outermost-front-surface high refractive index layer and the contact layer in the low reflectance region is λ/4, i.e., a case in which the contact layer has a uniform thickness of 25 nm. Here, it can be said that the thinner the contact layer in the low reflectance region is, the greater the oscillation suppressing effect in the high-order side mode becomes.

Further, the influences of the absorption by the contact layer are great at a waveband of 780 nm. Therefore, the reflectance in the low reflectance region cannot be made smaller than a case in which the thickness of the contact layer is 25 nm unless the thickness of the contact layer is reduced by at least 10 nm or more. On the other hand, the influences of the absorption by the contact layer are small at a waveband of 780 nm or greater. Therefore, even if the contact layer is thinned by 10 nm or smaller, the effect of increasing the reflectance difference can be obtained.

Further, the surface-emitting laser device 100A is structured such that the emitting region is protected by the dielectric layers. Therefore, oxidation and contamination under an environment atmosphere, breakage of the device caused when an Al containing layer takes up moisture in an external environment, or the like can be prevented. That is, a surface-emitting laser device excellent in long term reliability can be obtained.

Note that the description here is made of a case in which the normal-line direction of the main surface of the substrate 101 is inclined by 15 degrees toward the crystal orientation [1 1 1] A direction relative to the crystal orientation [1 0 0] direction. However, the normal-line direction is not limited to this. That is, the normal-line direction of the main surface of the substrate 101 may only be inclined toward the negative direction of the crystal orientation [1 1 1] relative to the negative direction of the crystal orientation [1 0 0].

Further, the description here is made of a case in which a protection layer and a mode filter are made of SiN. However, for example, the protection layer and the mode filter may be made of any one of SiNx, SiOx, TiOx, and SiON. Designing a film thickness in accordance with the refractive index of each of the materials can provide a similar effect.

Further, the description here is made of a case in which the optical thickness of each of the dielectric layers is λ/4. However, the optical thickness is not limited to this. For example, the optical thickness of each of the dielectric layers may be 3λ/4. In short, if the optical thickness of each of the dielectric layers is an odd number multiple of λ/4, the oscillation suppressing effect in the high-order side mode can be obtained like the surface-emitting laser device 100A.

Further, the description here is made of only a case in which the total optical thickness of the outermost-front-surface high refractive index layer and the contact layer is smaller than λ/4. However, the total optical thickness is not limited to this. If the optical thickness is deviated from an odd number multiple of λ/4, a similar effect can be obtained. Note that an increased thickness in the contact layer increases an absorption loss but is advantageous for the purpose of directly modulating laser light at high speeds because contact resistance and sheet resistance are reduced.

Further, the description here is made of a case in which the opening part of the p-side electrode 113 is a square shape. However, the shape of the opening part is not limited to this. The opening part of the p-side electrode 113 may be a shape such as a polygonal shape, a circular shape, an ellipse shape, and the like.

Subsequently, other configuration examples are described below. Although descriptions are focused on differences between the other configuration example and the first configuration example, constituents the same as or similar to those of the first configuration example are simplified or omitted.

Second Configuration Example

Figure 11A:
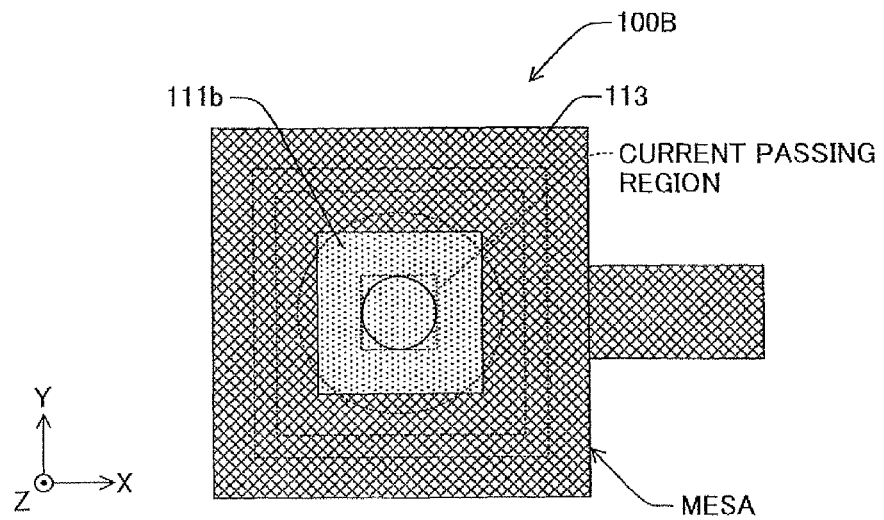
FIGS. 11A and 11B are views for explaining a surface-emitting laser device 100B according to a second configuration example.
Figure 11B:
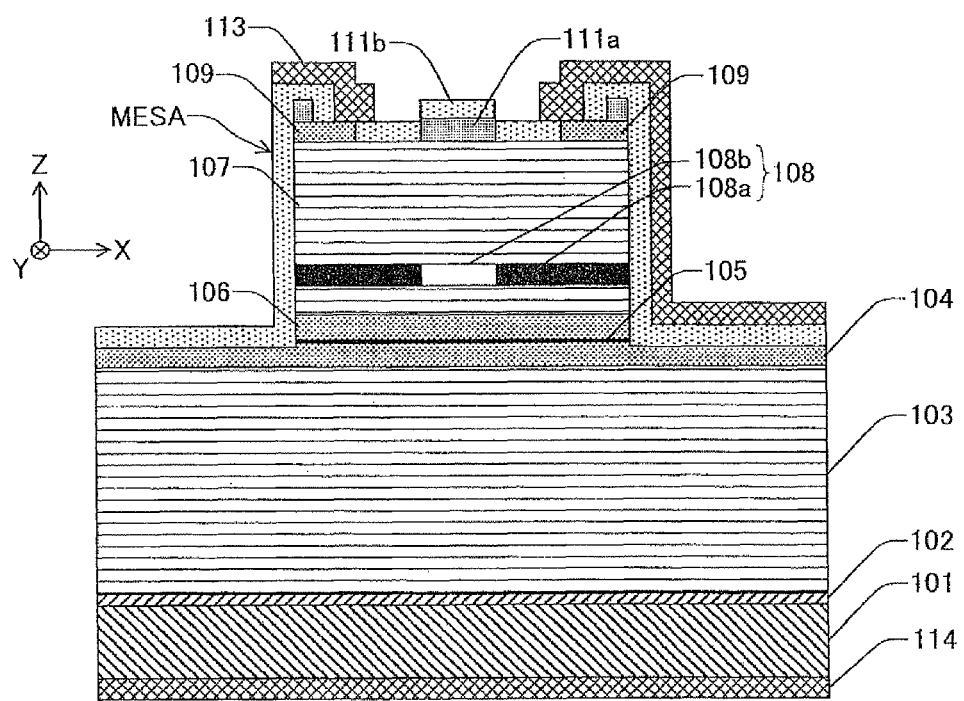

A surface-emitting laser device 100B according to a second configuration example is shown in FIGS. 11A and 11B. FIG. 11A is a plan view near an emitting part in the surface-emitting laser device 100B, and FIG. 11B is a cross-sectional view taken parallel along an X-Z plane in the surface-emitting laser device 100B.

The surface-emitting laser device 100B is different from the surface-emitting laser device 100A in that it has no contact layer right below a dielectric layer and has an outermost-front-surface high refractive index layer provided below the dielectric layer. As described above, the dielectric layer can be exemplified by a combination of a dielectric layer made of $SiO_2$ and a dielectric layer made of SiN.

A method for manufacturing the surface-emitting laser device 100B is described.

(B1) The laminated body is formed by crystal growth using a metal organic chemical vapor deposition method (MOCVD method) or a molecular beam epitaxial growing method (MBE method). However, the optical thickness of the outermost-front-surface high refractive index layer (including ½ of a composition inclined layer) is $\lambda/4$.

Figure 12:
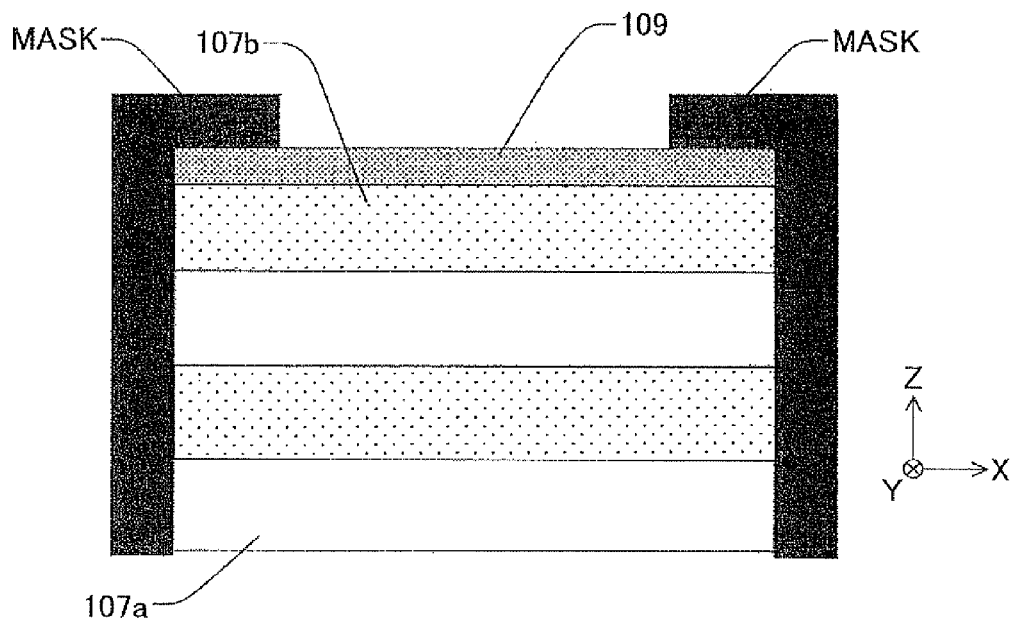
FIG. 12 is a view for explaining a mask for removing a contact layer in an emitting region.

(B2) On the front surface of a laminated body, an etching mask for etching a contact layer 109 other than a region in contact with a p-side electrode 113 is formed (see FIG. 12).

Figure 13:
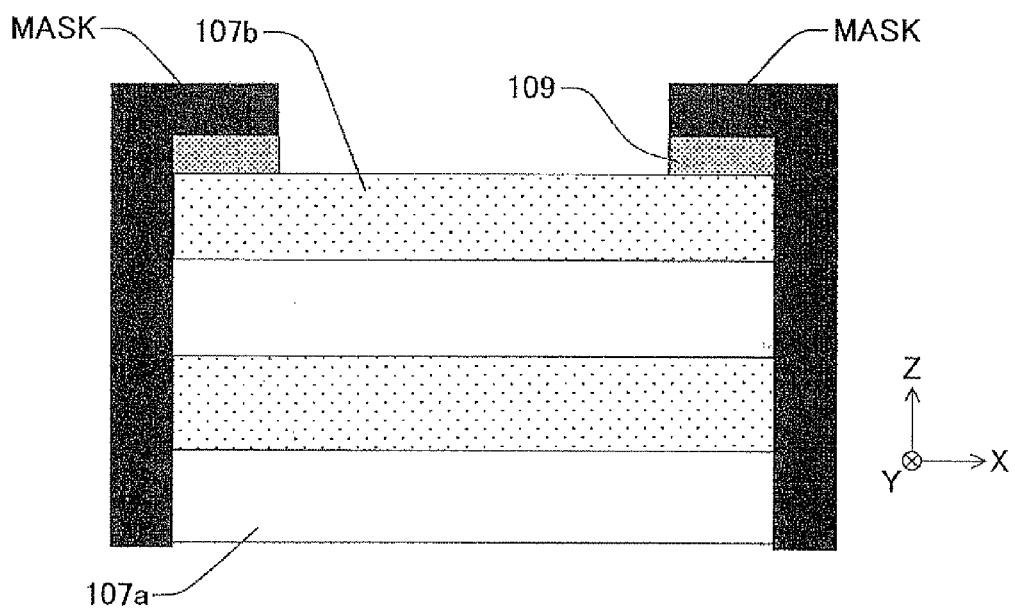
FIG. 13 is a view for explaining a state in which the contact layer in the emitting region is removed.

(B3) The laminated body is exposed to a mixed plasma atmosphere of silicon tetrachloride gas and oxygen gas, and only the contact layer 109 is selectively removed to expose a high refractive index layer 107b in a desired region (see FIG. 13). Note that in FIG. 13, the composition inclined layer is omitted.

Figure 14:
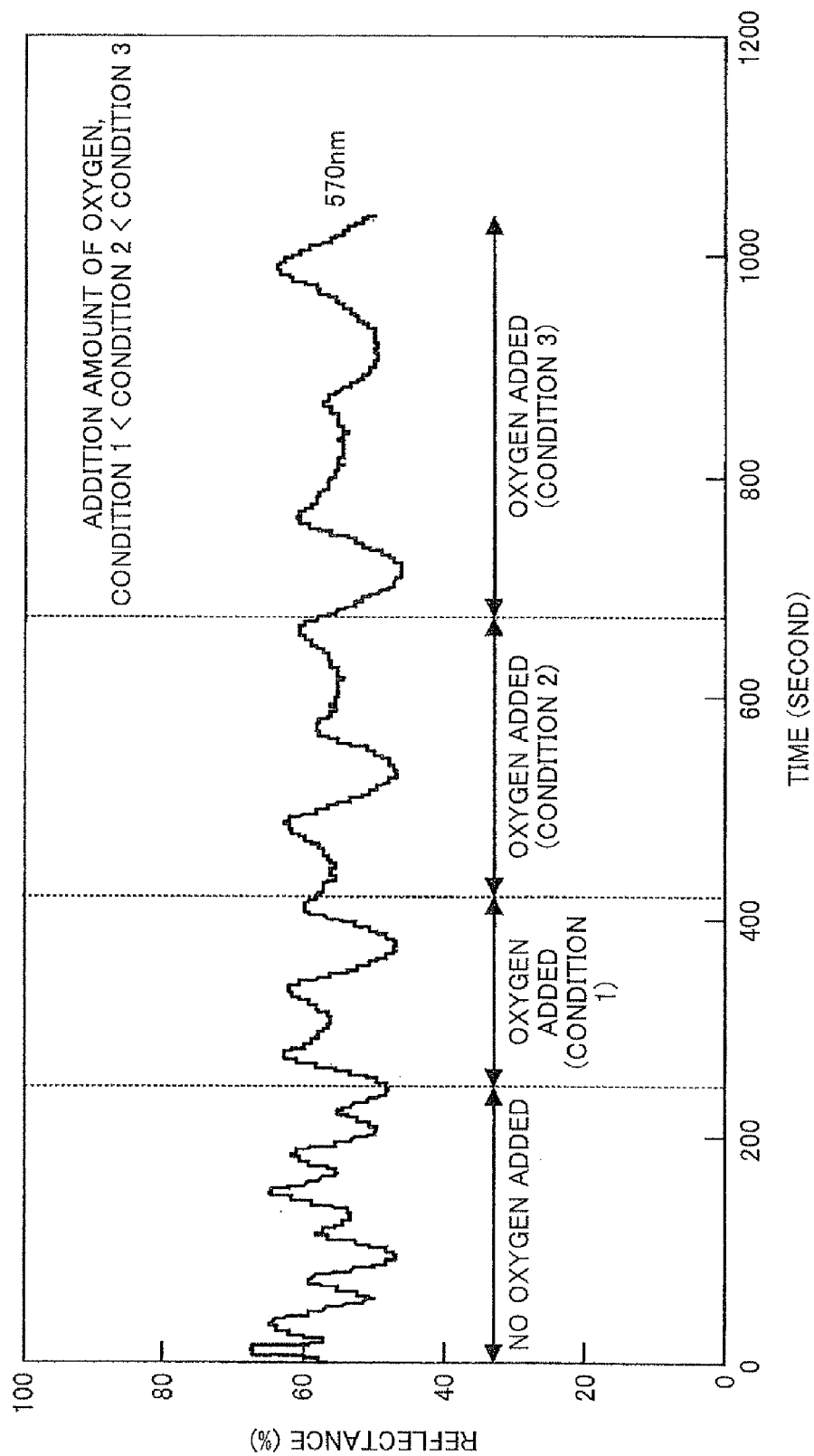
FIG. 14 is a graph for explaining a relationship between an etching speed in an upper semiconductor DBR and oxygen addition conditions.

Meanwhile, FIG. 14 shows a relationship between etching elapsed time and reflectance when an upper semiconductor DBR is experimentally etched. Note that a monitoring wavelength is 570 nm. The reflectance repeatedly increases and reduces every time one of a high refractive index layer and a low refractive index layer is etched. Here, etching was performed without the addition of oxygen at its starting time, and then performed under oxygen addition conditions 1 through 3 as time elapses. Note that an addition amount of oxygen is based on the following relationship condition 1<condition 2<condition 3. Compared with a case in which no oxygen is added, an etching speed becomes ⅓ of its original speed under, for example, the oxygen addition condition 3. On the other hand, in the contact layer, the etching speed is not varied regardless of whether oxygen is added. Therefore, for example, plasma treatment under an oxygen-added atmosphere makes it possible to selectively etch the contact layer and expose the outermost-front-surface high refractive index layer in a desired region.

Then, processes similar to the processes (A2) through (A18) of the first configuration example are performed.

Note that in the process similar to the process (A8) of the first configuration example, the front surface of the exposed part of the outermost-front-surface high refractive index layer is oxidized simultaneously with forming an oxidized confinement structure, thereby forming a soluble part soluble in acid and an alkali solution (see FIG. 15).

Then, FIG. 16 shows the state of the laminated body after the process similar to the process (A9) of the first configuration example is performed.

Meanwhile, when the contact layer 109 is removed in the process of (B3), the outermost-front-surface high refractive index layer may be thinned by etching. Therefore, it is necessary to thicken the outermost-front-surface high refractive index layer in advance.

In the surface-emitting laser device 100B thus manufactured, a second dielectric layer 111b having an optical thickness of $\lambda/4$ is provided at the peripheral part of an emitting region, and a dielectric layer composed of a first dielectric layer 111a having an optical thickness of $\lambda/4$ and the second dielectric layer 111b having an optical thickness of $\lambda/4$ are provided at the central part of the emitting region.

Figure 17:
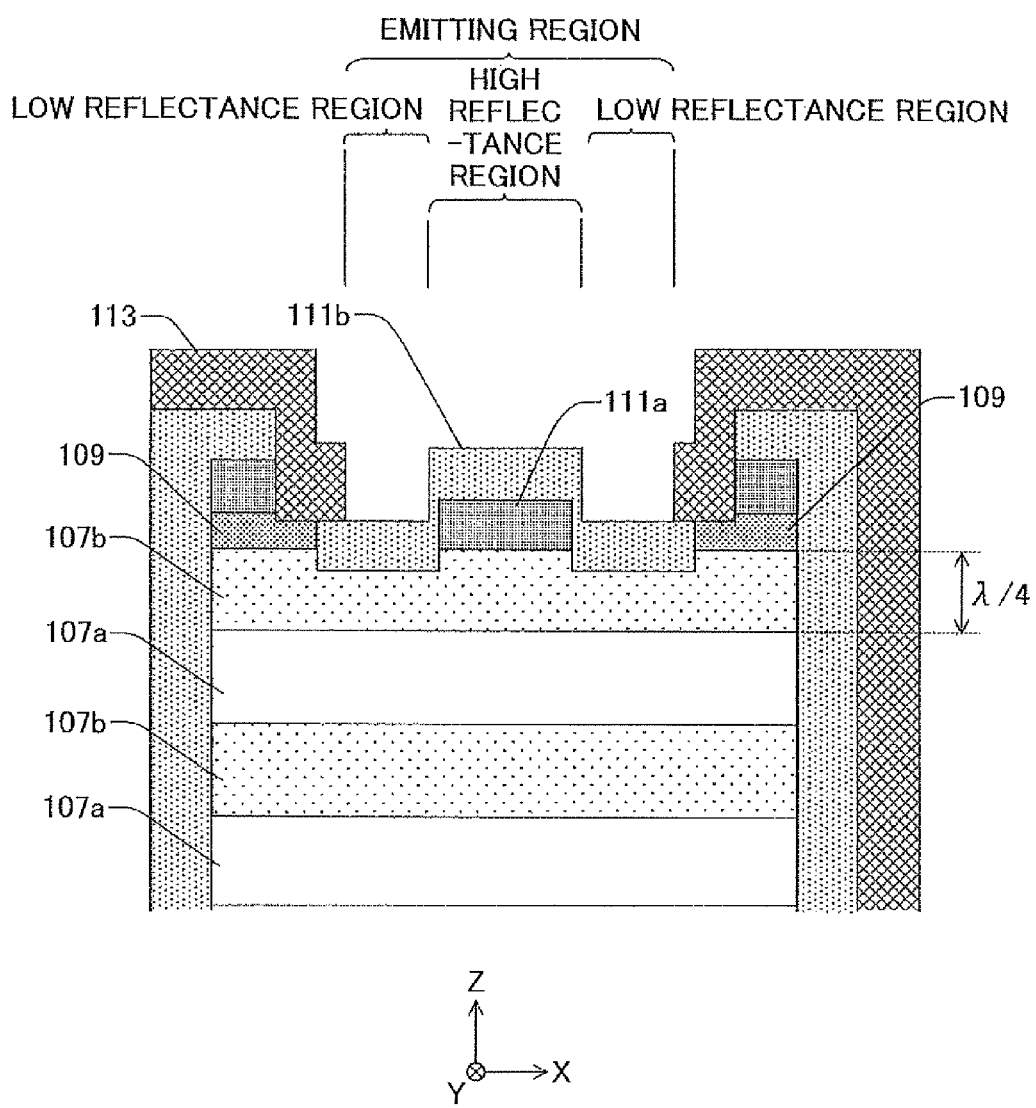
FIG. 17 is a partially-enlarged view of the surface-emitting laser device 100B in FIG. 11B.

In this case, the peripheral part of the emitting region becomes a region having a relatively low reflectance (low reflectance region), and the central part of the emitting region becomes a region having a relatively high reflectance (high reflectance region) (see FIG. 17).

Further, in the surface-emitting laser device 100B, the optical thickness of the outermost-front-surface high refractive index layer (including ½ of the composition inclined layer) in the high reflectance region is $\lambda/4$, and the optical thickness of the outermost-front-surface high refractive index layer (including ½ of the composition inclined layer) in the low reflectance region is smaller than $\lambda/4$. That is, the thickness of the outermost-front-surface high refractive index layer is different between the low reflectance region and the high reflectance region in the emitting region.

That is, in the surface-emitting laser device 100B, the dielectric layers are provided in each of the high reflectance region and the low reflectance region, the thickness of the outermost-front-surface high refractive index layer 109 in the high reflectance region is different from that of the outermost-front-surface high refractive index layer 109 in the low reflectance region, and the optical thickness of the outermost-front-surface high refractive index layer (including ½ of the composition inclined layer) in the low reflectance region is deviated from $\lambda/4$.

In this case, a reflectance difference between the low reflectance region and the high reflectance region can be increased more than ever before. As a result, a greater oscillation suppressing effect can be obtained in the high-order side mode. Note that the outermost-front-surface high refractive index layer is made of p-$Al_{0.3}Ga_{0.7}As$ and has a small absorption coefficient at a waveband of 780 nm. Therefore, in the surface-emitting laser device 100B, it is not necessary to consider the absorption coefficient unlike the GaAs contact layer of the first configuration example.

Each of the dielectric layer 111a and the dielectric layer 111b has an optical thickness of $\lambda/4$. Further, the dielectric layer 111a has a smaller refractive index than that of the dielectric layer 111b.

In this case, the dielectric layer 111a and the dielectric layer 111b form a pair of dielectric multilayer film reflecting mirrors at the central part of the emitting region, which in turn increases a reflectance. Conversely, reflected waves having an opposite phase are generated at a boundary between the dielectric layer 111b and air at the peripheral part of the emitting region, which in turn reduces reflectance.

Light intensity in the basic side mode tends to increase at the central part of the emitting region and reduce toward the peripheral part. Conversely, light intensity in the high-order side mode tends to increase at least at the peripheral part of the emitting region. In the surface-emitting laser device 100B, a reflectance increases at the central part of the emitting region, while reducing at the peripheral part thereof. Therefore, only oscillations in the high-order side mode are suppressed without reducing an output in the basic mode.

Further, the optical thickness of the outermost-front-surface high refractive index layer (including ½ of the composition inclined layer) in the low reflectance region is deviated from $\lambda/4$. In this case, a reflectance in the low reflectance region reduces because a phase with respect to stationary waves is deviated in the outermost-front-surface high refractive index layer. As a result, a reflectance difference between the central part and the peripheral part is further increased, which in turn further improves the oscillation suppressing effect in the high-order side mode.

Here, prior to forming the dielectric layer 111a, the contact layer 109 in the emitting region is removed. Further, the dielectric layer 111a is formed in a part corresponding to the high reflectance region, and the front surface of the outermost-front-surface high refractive index layer corresponding to the low reflectance region is oxidized while forming the oxidized confinement structure. If the outermost-front-surface high refractive index layer is oxidized at its front surface, it is easily thinned by acid and alkali. In view of this, the outermost-front-surface high refractive index layer having its front surface oxidized is immersed in ammonia water so as to be thinned at its part corresponding to the low reflectance region. Thus, the optical thickness of the outermost-frontsurface high refractive index layer (including ½ of the composition inclined layer) in the low reflectance region is set to be smaller than λ/4.

Third Configuration Example

Figure 18A:
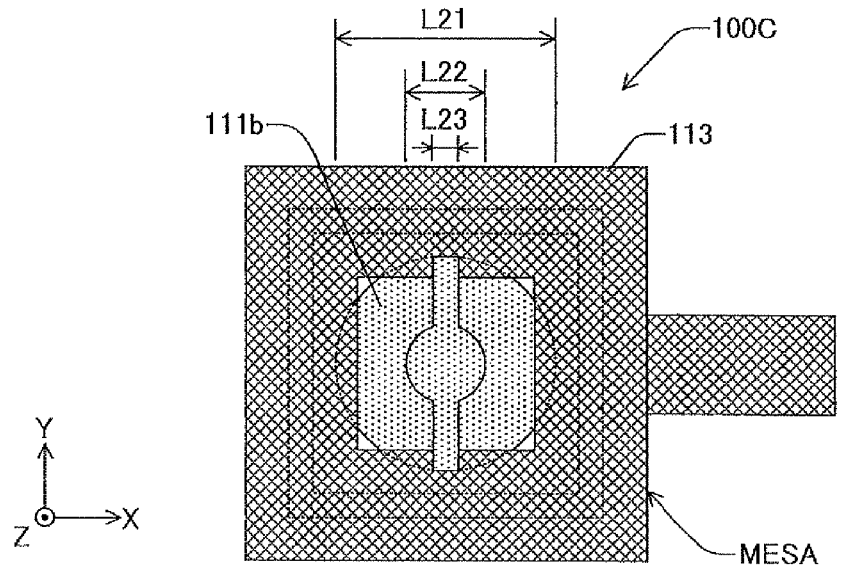
FIGS. 18A and 18B are views for explaining a surface-emitting laser device 100C according to a third configuration example.
Figure 18B:
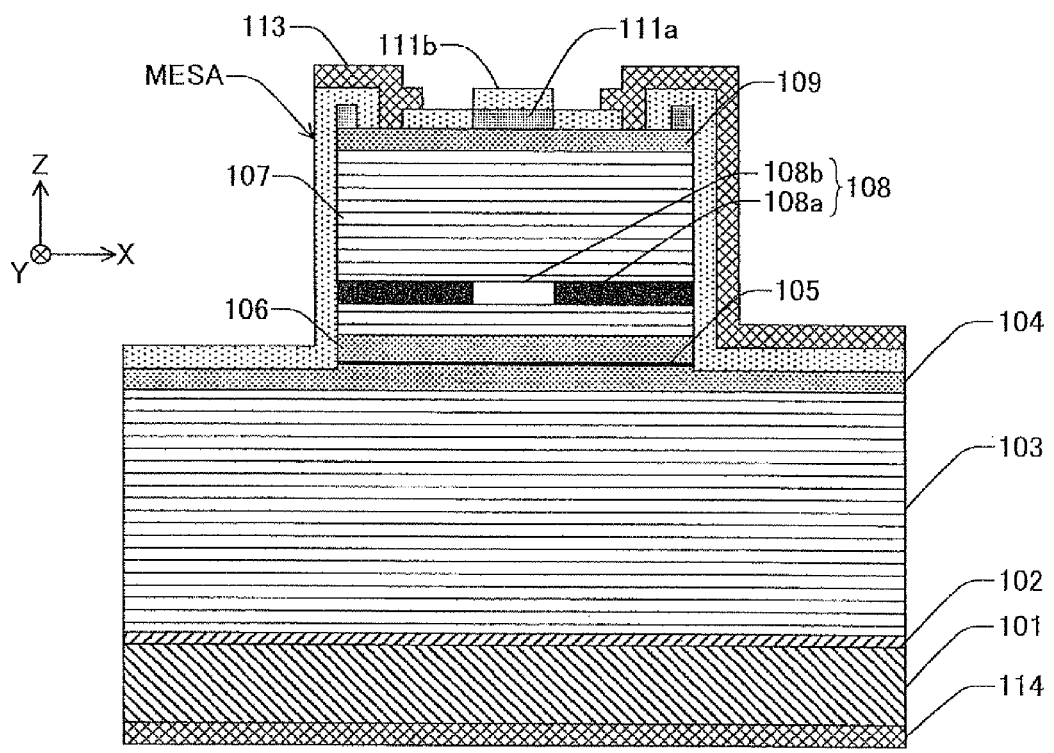

A surface-emitting laser device 100C according to a third configuration example is shown in FIGS. 18A and 18B. FIG. 18A is a plan view near an emitting part in the surface-emitting laser device 100B, and FIG. 18B is a cross-sectional view taken parallel along an X-Z plane in the surface-emitting laser device 100C. Note that in FIG. 18A, symbol L21 represents a length of about 15 μm, symbol L22 represents a length of about 5 μm, and symbol L23 represents a length of about 2 μm.

The surface-emitting laser device 100C is different from the surface-emitting laser device 100A in that a high reflectance region has shape anisotropy in an X-axis direction and a Y-axis direction. In this case, since light confinement action has anisotropy, a polarization direction is defined in a characteristic direction. As a result, the surface-emitting laser device having a more stable polarization direction can be obtained.

Figure 19:
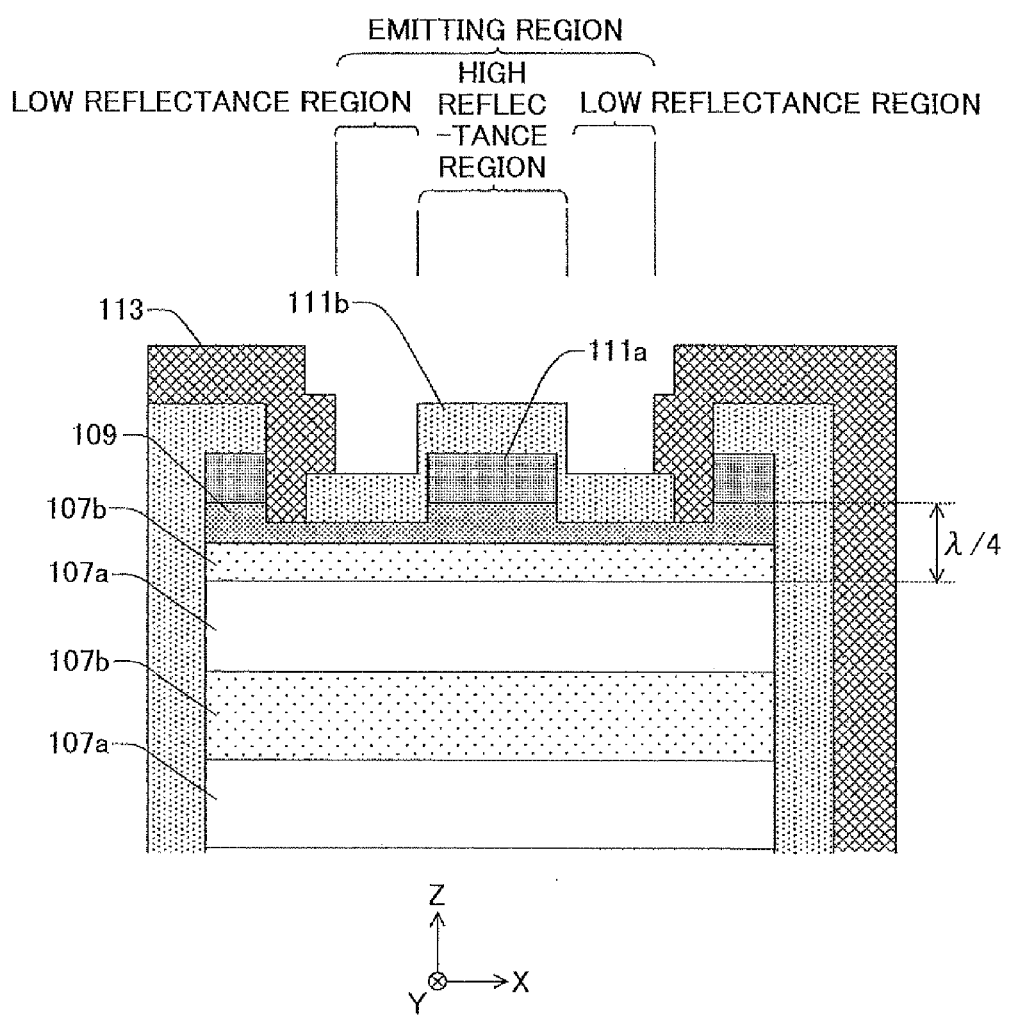
FIG. 19 is a partially-enlarged view of the surface-emitting laser device 100C in FIG. 18B.

That is, in the surface-emitting laser device 100C, dielectric layers are provided in each of a high reflectance region and a low reflectance region, the thickness of a contact layer 109 in the high reflectance region is different from that of the contact layer 109 in the low reflectance region, and the total optical thickness of an outermost-front-surface high refractive index layer (including ½ of a composition inclined layer) and the contact layer 109 in the low reflectance region is deviated from λ/4 (see FIG. 19).

In this case, like the surface-emitting laser device 100A, a reflectance difference between the low reflectance region and the high reflectance region can increase more than ever before. As a result, a greater oscillation suppressing effect can be obtained in the high-order side mode.

Meanwhile, the low reflectance region of the surface-emitting laser device 100C is slightly smaller than that of the surface-emitting laser device 100A. Therefore, the surface-emitting laser device 100C has a slightly lower output in the basic side mode than the surface-emitting laser device 100A.

However, in the surface-emitting laser device 100C, a substantially high output of 2.0 mW or more was obtained in the basic side mode even if the area of its current passing region is 30 μm². Further, in the surface-emitting laser device 100C, the polarization direction of emitted light is stable. Therefore, a PMSR (Polarization Mode Suppression Ratio) of 20 dB or more was obtained. Note that the PMSR is a ratio of light intensity in a desired polarization direction to light intensity in a direction orthogonal to the desired polarization direction. For example, a copier requires about 20 dB for it.

In this case, even if the outermost-front-surface high refractive index layer is provided right below the dielectric layers like the second configuration example, a similar effect can be obtained.

Fourth Configuration Example

Figure 20A:
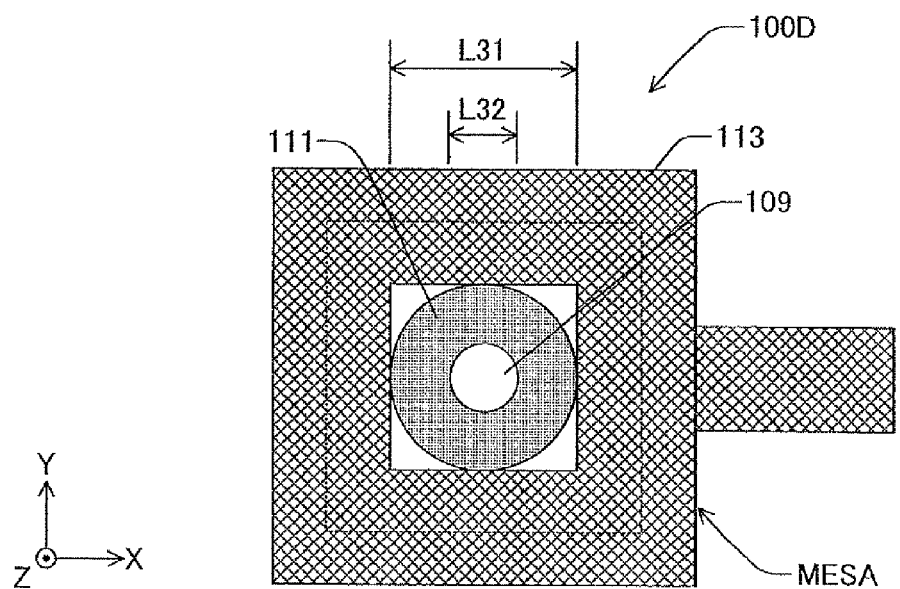
FIGS. 20A and 20B are views for explaining a surface-emitting laser device 100D according to a fourth configuration example.
Figure 20B:
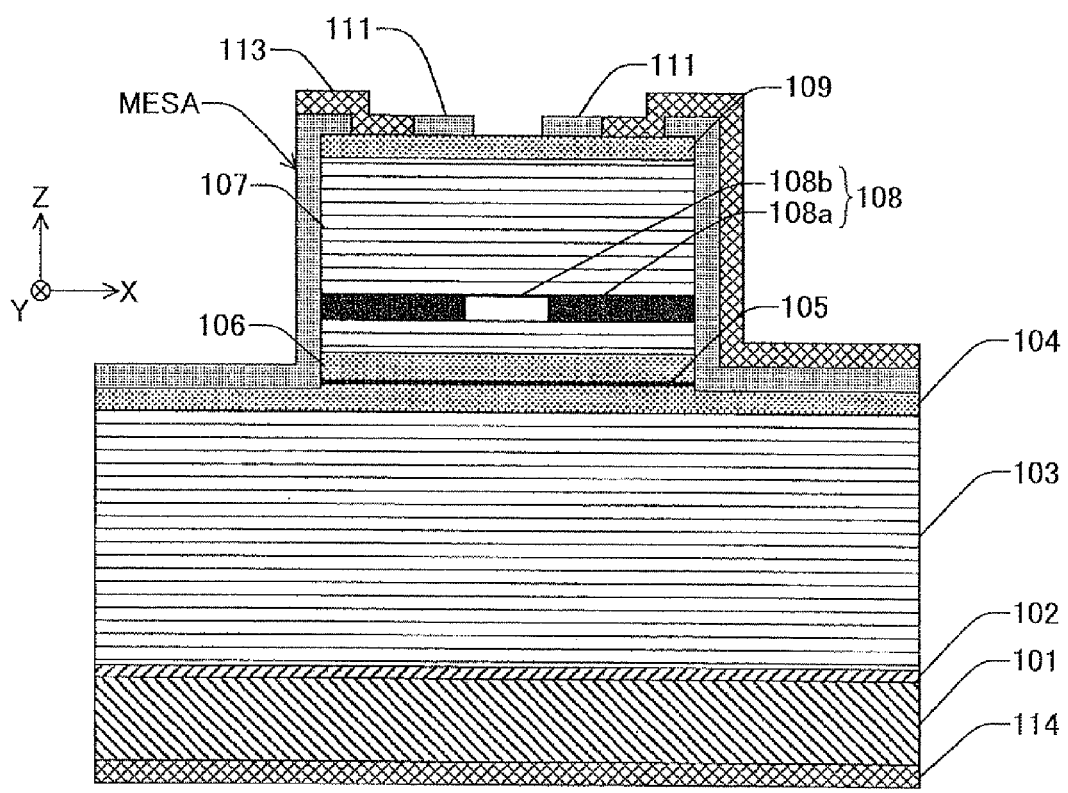

A surface-emitting laser device 100D according to a fourth configuration example is shown in FIGS. 20A and 20B. FIG. 20A is a plan view near an emitting part in the surface-emitting laser device 100D, and FIG. 20B is a cross-sectional view taken parallel along an X-Z plane in the surface-emitting laser device 100D. Note that in FIG. 20A, symbol L31 represents a length of about 13 μm, and symbol L32 represents a length of about 5 μm.

The surface-emitting laser device 100D is different from the surface-emitting laser device 100A in that it has a dielectric layer 111 provided only in a low reflectance region.

Here, the thickness of a contact layer 109 is 40 nm, and the total optical thickness of an outermost-front-surface high refractive index layer (including ½ of a composition inclined layer) and the contact layer 109 is set to be λ/4 if the thickness of the contact layer 109 is 25 nm.

A method for manufacturing the surface-emitting laser device 100D is described.

(D1) A laminated body is formed by crystal growth using a metal organic chemical vapor deposition method (MOCVD method) or a molecular beam epitaxial growing method (MBE method).

(D2) On the front surface of the laminated body, a dielectric layer 111 made of $SiO_2$ and having a thickness of about 20 nm is formed by a chemical vapor deposition method (CVD method).

(D3) An etching mask including a resist pattern defining the outer shape of a mesa is formed.

(D4) The laminated body is etched by an ECR etching method using $Cl_2$ gas to form a quadrangular-column-shaped mesa having at least a selective oxidized layer 108 exposed at its side surface. Here, etching is performed down to a lower spacer layer.

(D5) The etching mask is removed.

(D6) The laminated body is heat-treated in water vapor. Thus, Al (aluminum) of the selective oxidized layer 108 is selectively oxidized from the peripheral part of the mesa. Then, a non-oxidized region 108b surrounded by an oxide 108a of Al is caused to remain at the center of the mesa. That is, an oxidized confinement structure is formed that allows the driving current of a light-emitting part to be supplied only at the center of the mesa. The non-oxidized region 108b is a current passing region. Thus, the substantially-square-shaped current passing region having a width of, for example, 4 through 6 μm is formed.

(D7) The laminated body is immersed in BHF having a concentration of 10%. Thus, the $SiO_2$ film having a thickness of 20 nm provided on the mesa is etched and the adhesion of a dielectric film to be subsequently formed is improved.

(D8) The dielectric layer 111 made of SiN is formed by a chemical vapor deposition method (CVD method). Here, the dielectric layer 111 is set to have an optical thickness of λ/4. Specifically, since SiN has a refractive index n of 1.86 and an oscillation wavelength λ of 780 nm, an actual film thickness (=λ/4n) is set to be about 105 nm.

(D9) An etching mask for exposing the contact layer of a part having a relatively high reflectance at the upper part of the mesa serving as the emitting surface of laser light and a part serving as a contact hole is formed. Here, the shape of the low reflectance region is a doughnut shape having an outer diameter L31 (here about 13 μm) and an inner diameter L32 (here about 5 μm).

(D10) The dielectric layer 111 is etched by BHF.

(D11) The laminated body is exposed to oxygen plasma. Thus, the etching mask is removed. Further, at the same time, the front surface of the exposed part of the contact layer 109 is oxidized to form a soluble part soluble in acid and an alkali solution. Here, the soluble part has a depth of about 15 nm.

Note here that an oxygen flow was 300 ml/min., a discharge pressure was 100 Pa, an input power was 500 W, and exposed time was 20 minutes.

(D12) The laminated body is immersed in ammonia water for 40 seconds. Thus, the soluble part of the contact layer 109 is removed. Note that the ammonia water was used here to remove the soluble part, but acid and other alkali solutions may be used. For example, a hydrochloric acid solution, a phosphoric acid solution, an alkali developing solution, or the like may be used.

Then, processes similar to the processes (A14) through (A18) of the first configuration example are performed.

Figure 21A:
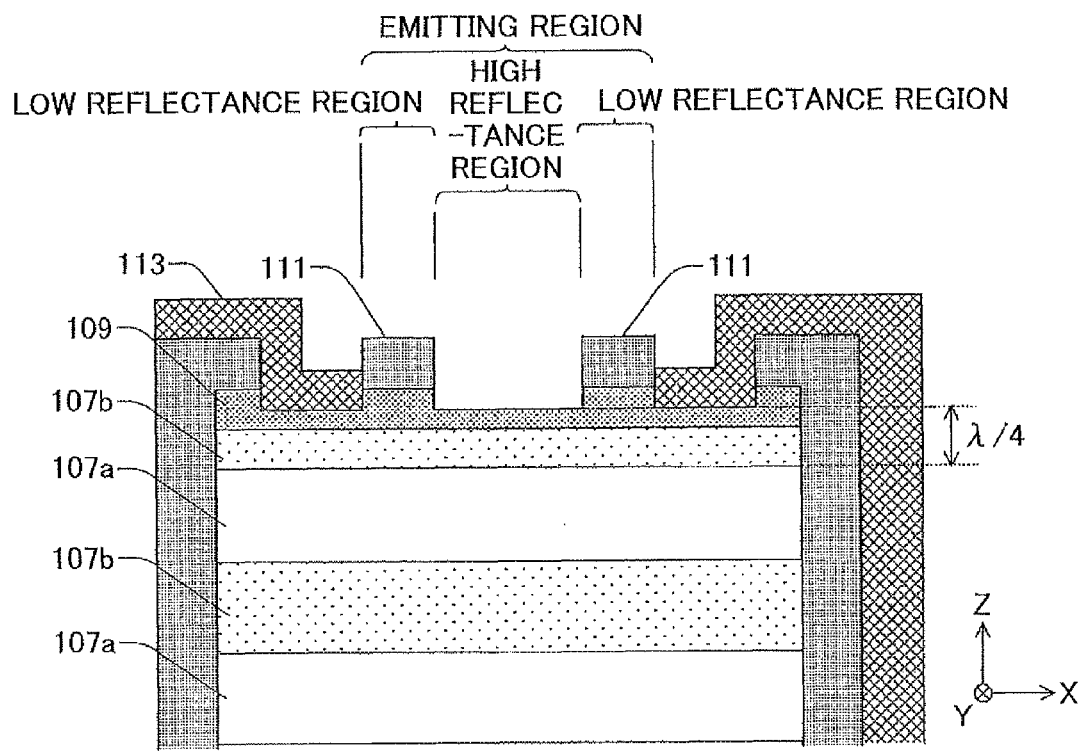
FIGS. 21A and 21B are partially-enlarged views of the surface-emitting laser device 100D in FIG. 20B.
Figure 21B:
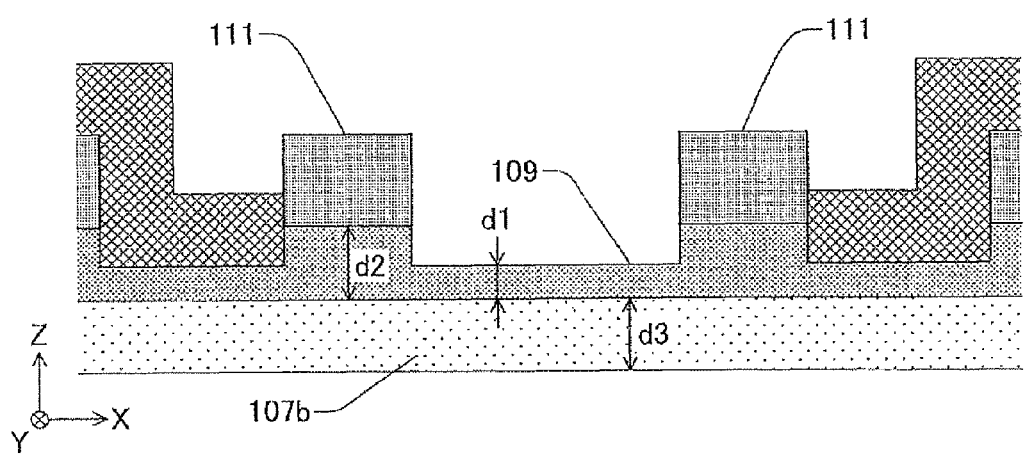

In the surface-emitting laser device 100D thus manufactured, a thickness d1 of the contact layer in the high reflectance region is 25 nm, and a thickness d2 of the contact layer in the low reflectance region is 40 nm (see FIGS. 21A and 21B).

Further, in the high reflectance region, the total optical thickness (d1+d3) of the contact layer and the outermost-front-surface high refractive index layer is $\lambda/4$. Further, in the low reflectance region, the total optical thickness (d2+d3) of the contact layer and the outermost-front-surface high refractive index layer (including ½ of the composition inclined layer) is greater than $\lambda/4$.

That is, in the surface-emitting laser device 100D, the dielectric layer is provided in the low reflectance region, the thickness of the contact layer 109 in the high reflectance region is different from that of the contact layer 109 in the high reflectance region, and the total optical thickness of the outermost-front-surface high refractive index layer (including ½ of the composition inclined layer) and the contact layer 109 in the low reflectance region is deviated from $\lambda/4$.

In this case, a reflectance difference between the low reflectance region and the high reflectance region can be increased more than ever before. As a result, a greater oscillation suppressing effect can be obtained in the high-order side mode.

The optical thickness of the dielectric layer 111 is $\lambda/4$. At the central part of the emitting region, the reflectance does not change because the dielectric layer is not provided. On the other hand, at the peripheral part of the emitting region, the reflectance reduces because reflected waves having an opposite phase are generated at a boundary between the dielectric layer 111 and air due to the dielectric layer 111 having an optical thickness of $\lambda/4$. Therefore, the central part of the emitting region becomes a region having a relatively high reflectance.

Here, the laminated body is formed such that the total optical thickness of the outermost-front-surface high refractive index layer (including ½ of the composition inclined layer) and the contact layer 109 is deviated from $\lambda/4$. Then, after the selective oxidized layer 108 is selectively oxidized to form the oxidized confinement structure, the dielectric layer 111 is formed at a part other than the region having a relatively high reflectance and a part corresponding to a contact hole. Then, the laminated body is exposed to oxygen plasma to oxidize the front surface of the exposed part of the contact layer. If the contact layer is oxidized at its front surface, it is easily thinned by acid and alkali. In view of this, the contact layer having its front surface oxidized is immersed in ammonia water so as to be thinned at its part corresponding to the part having a relatively high reflectance. Thus, the total optical thickness of the outermost-front-surface high refractive index layer (including ½ of the composition inclined layer) and the contact layer in the region having a relatively high reflectance is set to be $\lambda/4$, and the total optical thickness of the outermost-front-surface high refractive index layer (including ½ of the composition inclined layer) and the contact layer in the low reflectance region is set to be greater than $\lambda/4$.

In a case where the dielectric layer is not provided in the region having a relatively high reflectance as described above, the contact layer 109 in the low reflectance region is masked by the dielectric layer 111 unlike the first configuration example. Therefore, the contact layer 109 in the region having a relatively high reflectance is thinned. In this case, in order to shift a phase in the low reflectance region, it is only necessary to recognize an amount to be thinned of the contact layer 109 and thicken the contact layer 109 by the corresponding amount in advance. As a result, since the total optical thickness of the outermost-front-surface high refractive index layer (including ½ of the composition inclined layer) and the contact layer is deviated from $\lambda/4$ in the low reflectance region, the reflectance reduces. Accordingly, the reflectance difference between the central part and the peripheral part is increased more than ever before.

Figure 22:
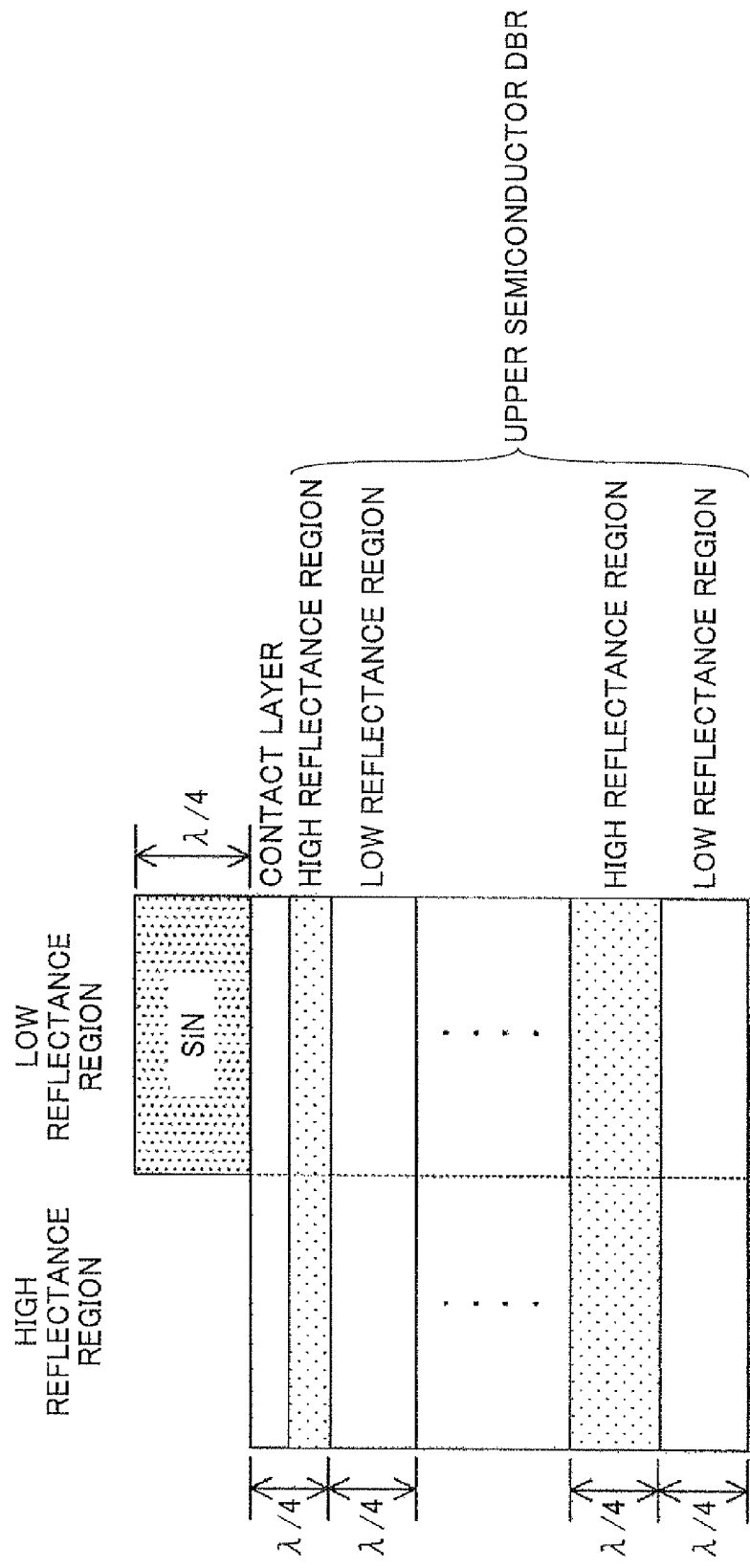
FIG. 22 is a view for explaining a model used for calculation.

In order to confirm the effect of deviating from $\lambda/4$ the total optical thickness of the outermost-front-surface high refractive index layer (including ½ of the composition inclined layer) and the contact layer in the low reflectance region, a reflectance was calculated using a one-dimensional calculation model shown in FIG. 22. In this calculation model, 25 pairs of $Al_{0.3}Ga_{0.7}As$ and $Al_{0.9}Ga_{0.1}As$ each having an optical thickness of $\lambda/4$ are laminated as an upper semiconductor DBR, and the contact layer is formed on a high refractive index layer closest to an emitting surface. Further, the dielectric layer having an optical thickness of $\lambda/4$ and made of SiN (n=1.87) is formed on the front surface of the contact layer. Moreover, if the thickness of the contact layer is 25 nm, the total optical thickness of the outermost-front-surface high refractive index layer and the contact layer in the upper semiconductor DBR is set to be $\lambda/4$.

Figure 23A:
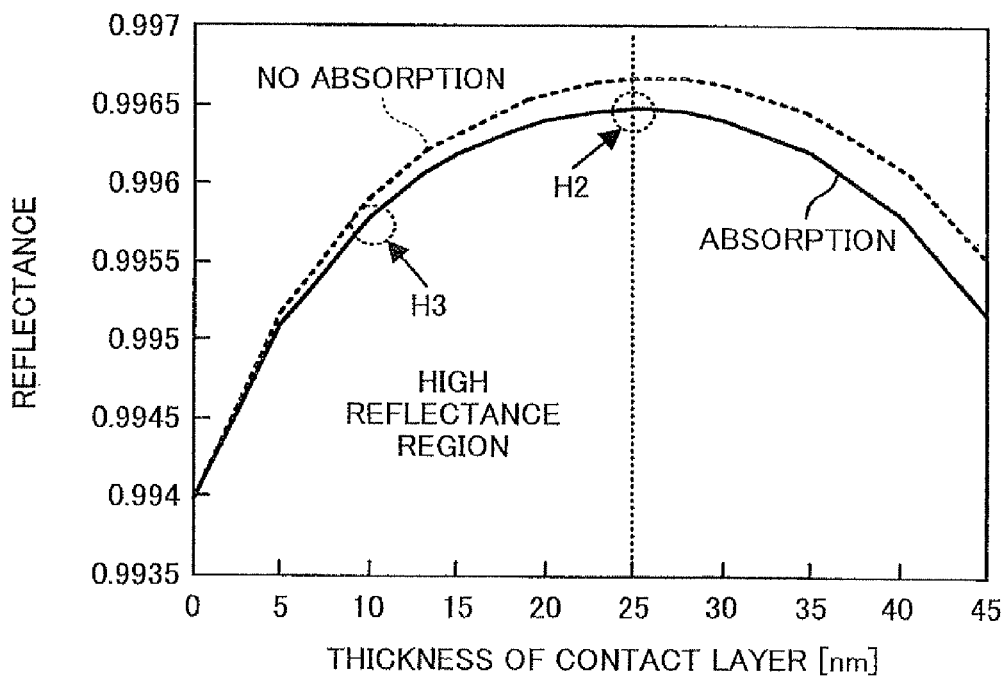
FIGS. 23A and 23B are graphs for explaining calculation results.
Figure 23B:
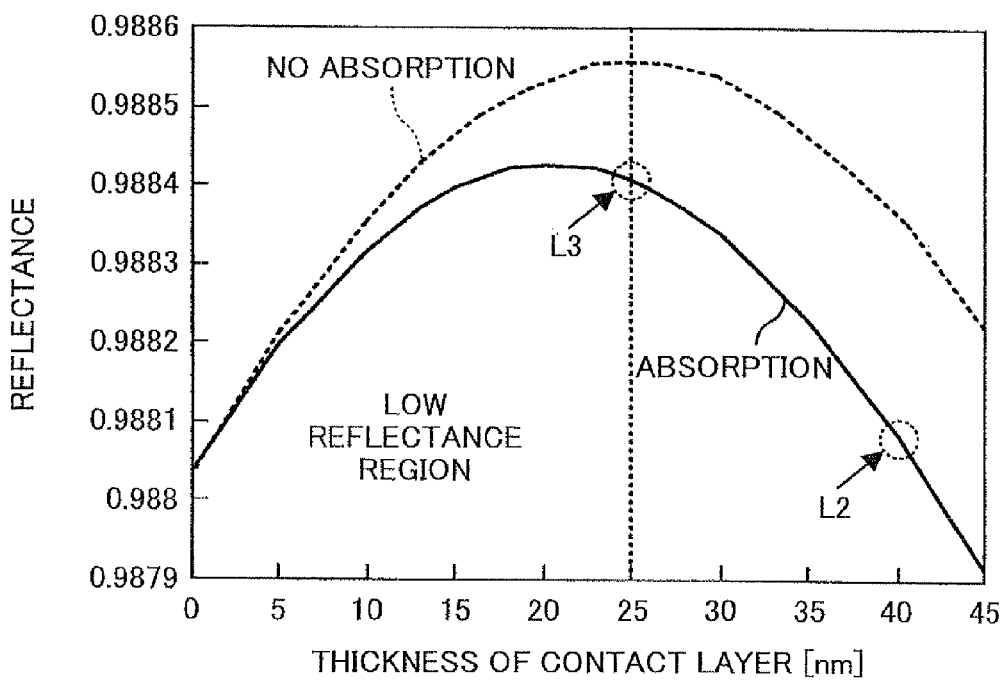

In this calculation model, FIGS. 23A and 23B show the calculation results of the reflectance in the high reflectance region (region having a relatively high reflectance) and the low reflectance region, respectively, where only the thickness of the contact layer is changed.

In FIGS. 23A and 23B, solid lines indicate the calculation results where the absorption loss coefficient of the contact layer is set to be 10000 [$cm^{-1}$], and broken lines indicate the calculation results where the absorption loss coefficient of the contact layer is set to be zero for comparison. Since the absorption coefficient of GaAs is about 10000 [$cm^{-1}$] at a waveband of 780 nm, the results indicated by the solid lines are values closer to actual values.

As shown in FIG. 23A, regardless of the presence or absence of absorption, there is a tendency that the reflectance becomes maximum when the thickness of the contact layer approximates 25 nm and reduces when the thickness of the contact layer is deviated from 25 nm in the high reflectance region. This is because the total optical thickness of the outermost-front-surface high refractive index layer and the contact layer is deviated from $\lambda/4$.

As shown in FIG. 23B, if the absorption coefficient is zero, there is a tendency that the reflectance becomes maximum when the thickness of the contact layer approximates 25 nm and reduces when the thickness of the contact layer is deviated from 25 nm in the low reflectance region. As opposed to this, if the absorption occurs, there is a tendency that the reflectance becomes maximum when the thickness of the contact layer is smaller than 25 nm and approximates 20 nm and reduces when the thickness of the contact layer is deviated from 20 nm.

As described above, the reflectance becomes maximum when the thickness of the contact layer is 20 nm rather than being 25 nm. This is because the reflectance reduces since the total optical thickness of the outermost-front-surface high refractive index layer and the contact layer is deviated from $\lambda/4$ when the thickness of the contact layer is 20 nm but increases due to a reduction in absorption loss when the thickness of the contact layer is smaller than 25 nm.

The reason why the tendencies are different depending on the values of the absorption coefficients between the high reflectance region and the low reflectance region is that the influences of the absorption by the contact layer are likely to emerge in the low reflectance region because the reflectance in the low reflectance region is relatively small.

Accordingly, as compared with a case in which the thickness of the contact layer is 25 nm in the low reflectance region, it is found that a greater reflectance difference can be obtained if the thickness of the contact layer approximates 25 nm in the high reflectance region and the thickness of the contact layer is greater than 25 nm or smaller than 25 nm by 10 nm or more in the low reflectance region.

For example, if the contact layer is thinned by 15 nm, the thickness of the contact layer in the high reflectance region is 25 nm on the condition that the thickness of the contact layer is set to be 40 nm at its formation. Further, the thickness of the contact layer in the low reflectance region remains 40 nm and becomes thicker than that of the contact layer in the high reflectance region by 15 nm. At this time, the high reflectance region corresponds to a position H2 in FIG. 23A, and the low reflectance region corresponds to a position L1 in FIG. 23B.

Assuming that the reflectance at the position H2 is $R_{H2}$ and the reflectance at the position L2 is $R_{L2}$, the reflectance difference is $R_{H2}-R_{L2}$. This reflectance difference is greater than a case in which the total optical thickness of the outermost-front-surface high refractive index layer and the contact layer in the low reflectance region is $\lambda/4$, i.e., a case in which the contact layer has a thickness of 25 nm. Here, it can be said that the thicker the contact layer in the low reflectance region is, the greater the oscillation suppressing effect in the high-order side mode becomes.

On the other hand, if the contact layer is not thickened in advance, the reflectance difference becomes small. For example, in a case where the thickness of the contact layer is set to be 25 nm, the contact layer in the high reflectance region is caused to have a thickness of 10 nm when thinned. At this time, the high reflectance region corresponds to a position H3 in FIG. 23A, and the low reflectance region corresponds to a position L3 in FIG. 23B.

Assuming that the reflectance at the position H3 is $R_{H3}$ and the reflectance at the position L3 is $R_{L3}$, the reflectance difference is $R_{H3}-R_{L3}$. This reflectance difference is smaller than the above-described reflectance difference $R_{H3}-R_{L3}$, i.e., a case in which the total optical thickness of the outermost-front-surface high refractive index layer and the contact layer in the low reflectance region is set to be greater than $\lambda/4$. As a result, the oscillation suppressing effect in the high-order side mode is reduced.

Further, the influences of the absorption by the contact layer are great at a waveband of 780 nm. Therefore, the reflectance becomes maximum when the thickness of the contact layer is smaller than 25 nm. However, in this configuration example, since the contact layer in the high reflectance region is thinned, the thickness of the contact layer in the low reflectance region becomes greater than 25 nm. In this case, the reflectance in the low reflectance region further reduces due to the absorption loss of the contact layer. Therefore, the reflectance difference is further increased.

Further, in this configuration example, the effect of increasing the reflectance difference can be obtained even with a waveband at which the absorption loss of the contact layer is small. This is because the reflectance is reduced by shifting phases from each other between the contact layer and the outermost-front-surface high refractive index layer.

For example, at a waveband of 780 or more, the absorption coefficient of GaAs is reduced. However, as shown by a dashed line in FIG. 23B, it is found that, even if the absorption coefficient is zero, the effect of increasing the reflectance difference can be obtained when the total optical thickness of the outermost-front-surface high refractive index layer and the contact layer is deviated from $\lambda/4$.

Further, the description here is made of a case in which the optical thickness of the dielectric layer in the low reflectance region is $\lambda/4$. However, the optical thickness is not limited to this. For example, the optical thickness of the dielectric layer may be $3\lambda/4$. In short, if the optical thickness of the dielectric layer is an odd number multiple of $\lambda/4$, the oscillation suppressing effect in the high-order side mode can be obtained like the surface-emitting laser device 100D.

Further, the description here is made of only a case in which the total optical thickness of the outermost-front-surface high refractive index layer and the contact layer is smaller than $\lambda/4$. However, the total optical thickness is not limited to this. If the total optical thickness is deviated from an odd number multiple of $\lambda/4$, a similar effect can be obtained. Note that an increased thickness in the contact layer increases an absorption loss but is advantageous for the purpose of directly modulating laser light at high speed because contact resistance and sheet resistance are reduced.

Fifth Configuration Example

Figure 24A:
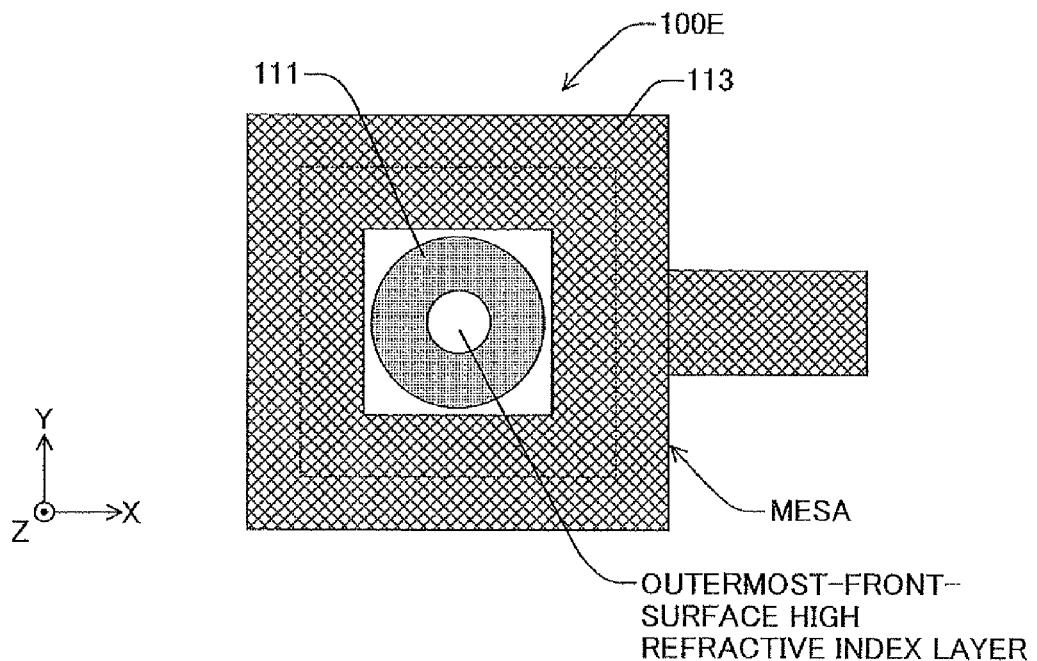
FIGS. 24A and 24B are views for explaining a surface-emitting laser device 100E according to a fifth configuration example.
Figure 24B:
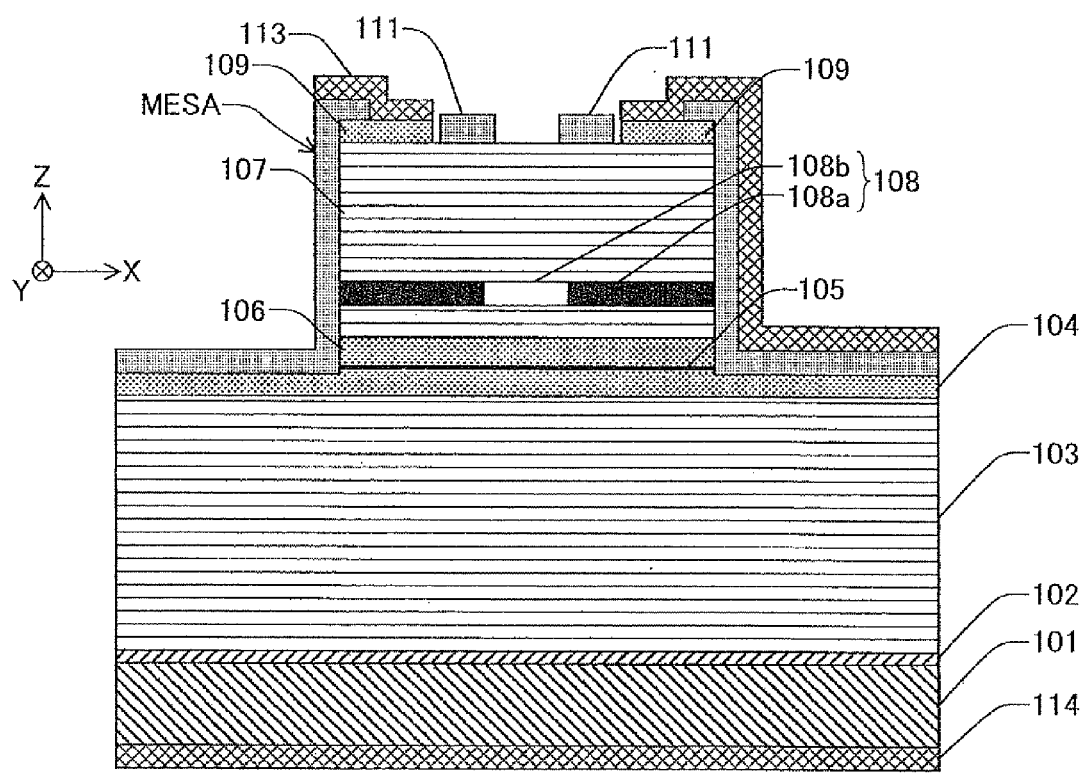

A surface-emitting laser device 100E according to a fifth configuration example is shown in FIGS. 24A and 24B. FIG. 24A is a plan view near an emitting part in the surface-emitting laser device 100E, and FIG. 24B is a cross-sectional view taken parallel along an X-Z plane in the surface-emitting laser device 100E.

The surface-emitting laser device 100E is different from the surface-emitting laser device 100D in that it has no contact layer right below a dielectric layer and has an outermost-front-surface high refractive index layer provided below the dielectric layer.

A method for manufacturing the surface-emitting laser device 100E is described.

(E1) A laminated body is formed by crystal growth using a metal organic chemical vapor deposition method (MOCVD method) or a molecular beam epitaxial growing method (MBE method). However, the thickness of the outermost-front-surface high refractive index layer (including ½ of a composition inclined layer) is 35 nm. Note that when the thickness of the outermost-front-surface high refractive index layer (including ½ of the composition inclined layer) is 25 nm, the optical thickness of the outermost-front-surface high refractive index layer becomes $\lambda/4$.

(E2) An etching mask for etching a contact layer 109 in a region corresponding to an emitting region is formed.

The laminated body is exposed to a mixed plasma atmosphere of silicon tetrachloride gas and oxygen gas, and the contact layer 109 in the region corresponding to the emitting region is removed. Thus, the outermost-front-surface high refractive index layer is exposed in the region corresponding to the emitting region.

Then, processes similar to the processes after (D2) of the fourth configuration example are performed.

Note that in the process similar to the process (D11) of the fourth configuration example, the front surface of the exposed part of the outermost-front-surface high refractive index layer is oxidized by 10 nm to form a soluble part soluble in acid and an alkali solution.

Then, in the process similar to the process (D12) of the fourth configuration example, the soluble part in the outermost-front-surface high refractive index layer is removed.

Figure 25A:
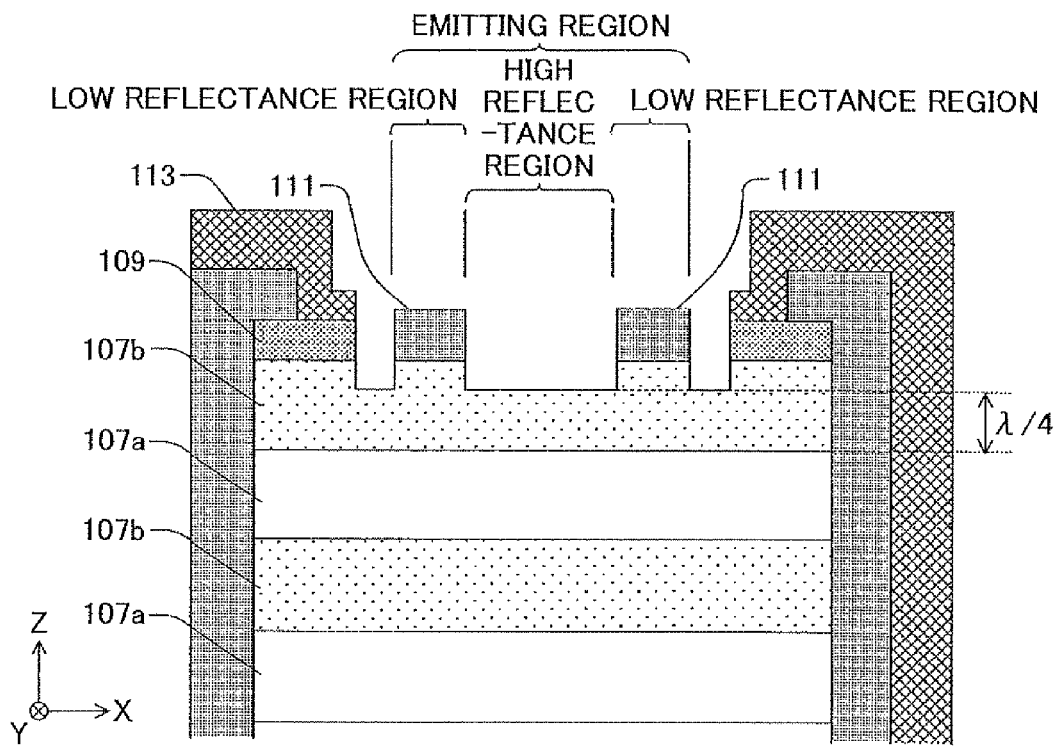
FIGS. 25A and 25B are partially-enlarged views of the surface-emitting laser device 100E in FIG. 24B.
Figure 25B:
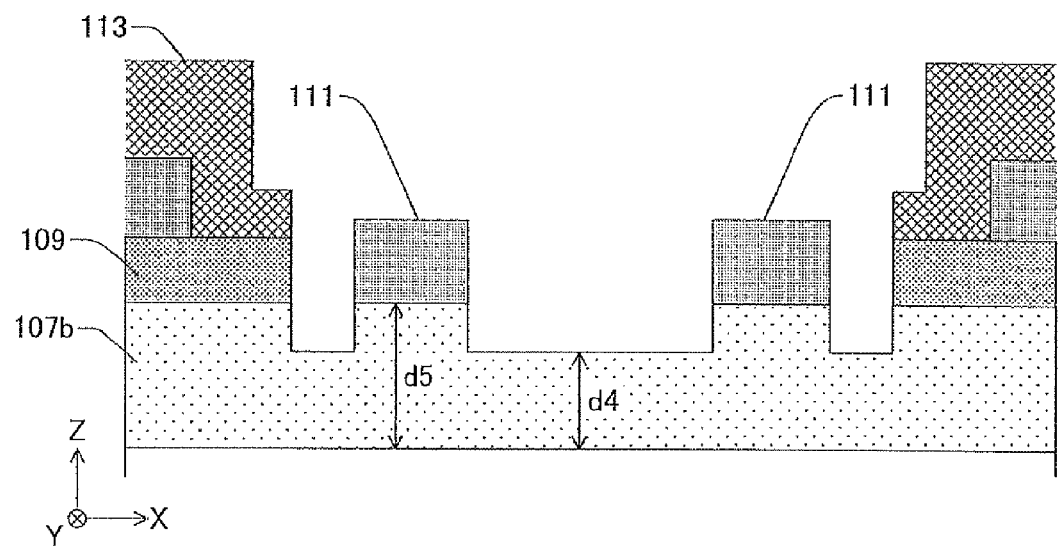

In the surface-emitting laser device 100E thus manufactured, a thickness d4 of the outermost-front-surface high refractive index layer (including ½ of the composition inclined layer) in the high reflectance region (region having a relatively high reflectance) is 25 nm, and a thickness d5 of the outermost-front-surface high refractive index layer (region having a relatively high reflectance) in the low reflectance region is 35 nm (see FIGS. 25A and 25B).

Then, in the high reflectance region, the optical thickness of the outermost-front-surface high refractive index layer (including ½ of the composition inclined layer) is $\lambda/4$. Further, in the low reflectance region, the optical thickness of the outermost-front-surface high refractive index layer (including ½ of the composition inclined layer) is greater than $\lambda/4$.

That is, in the surface-emitting laser device 100E, the dielectric layer is provided in the low reflectance region, the thickness of the outermost-front-surface high refractive index layer (including ½ of the composition inclined layer) in the high reflectance region is different from that of the outermost-front-surface high refractive index layer (including ½ of the composition inclined layer) in the low reflectance region, and the optical thickness of the outermost-front-surface high refractive index layer (including ½ of the composition inclined layer) in the low reflectance region is deviated from $\lambda/4$.

In this case, a reflectance difference between the low reflectance region and the high reflectance region can be increased more than ever before. As a result, a greater oscillation suppressing effect can be obtained in the high-order side mode.

The optical thickness of the dielectric layer 111 is $\lambda/4$. At the central part of the emitting region, the reflectance does not change because the dielectric layer is not provided. On the other hand, at the peripheral part of the emitting region, the reflectance reduces because reflected waves having an opposite phase are generated at a boundary between the dielectric layer 111 and air due to the dielectric layer 111 having an optical thickness of $\lambda/4$. Therefore, the central part of the emitting region is a region having a relatively high reflectance.

Here, the outermost-front-surface high refractive index layer (including ½ of the composition inclined layer) is formed so as to have an optical thickness of $\lambda/4$ after being thinned. Then, prior to forming a mesa, the contact layer in the emitting region is removed. Then, after a selective oxidized layer 108 is selectively oxidized to form an oxidized confinement structure, the dielectric layer 111 is formed at a part other than the region having a relatively high reflectance and a part corresponding to a contact hole. Then, the laminated body is exposed to oxygen plasma to oxidize the front surface of the exposed part of the outermost-front-surface high refractive index layer. If the outermost-front-surface high refractive index layer is oxidized at its front surface, it is easily thinned by acid and alkali. In view of this, the outermost-front-surface high refractive index layer having its front surface oxidized is immersed in ammonia water so as to be thinned at its part corresponding to the region having a relatively high reflectance. Thus, the optical thickness of the outermost-front-surface high refractive index layer (including ½ of the composition inclined layer) in the region having a relatively high reflectance is set to be $\lambda/4$, and the optical thickness of the outermost-front-surface high refractive index layer (including ½ of the composition inclined layer) in the low reflectance region is set to be greater than $\lambda/4$.

In a case where the dielectric layer is not provided in the region having a relatively high reflectance as described above, the outermost-front-surface high refractive index layer 109 in the low reflectance region is masked by the dielectric layer 111 unlike the second configuration example. Therefore, the outermost-front-surface high refractive index layer in the region having a relatively high reflectance is thinned. In this case, in order to shift a phase in the low reflectance region, it is only necessary to recognize an amount to be thinned of the outermost-front-surface high refractive index layer and thicken the outermost-front-surface high refractive index layer 109 by the corresponding amount in advance. As a result, since the optical thickness of the outermost-front-surface high refractive index layer (including ½ of the composition inclined layer) is deviated from $\lambda/4$ in the low reflectance region, the reflectance reduces. Accordingly, the reflectance difference between the central part and the peripheral part is increased more than ever before.

Sixth Configuration Example

Figure 26A:
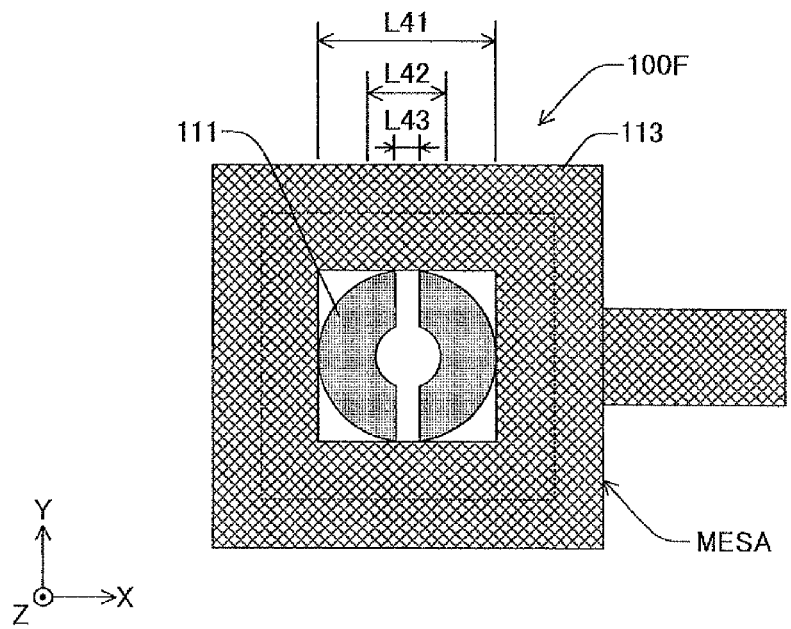
FIGS. 26A and 26B are views for explaining a surface-emitting laser device 100F according to a sixth configuration example.
Figure 26B:
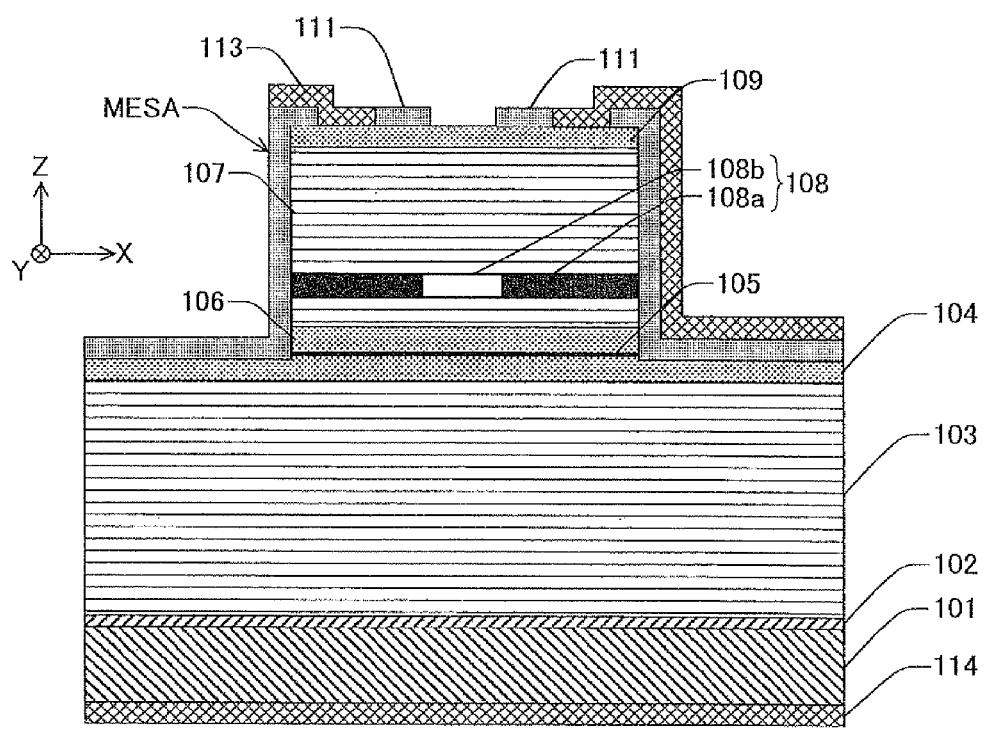

A surface-emitting laser device 100F according to a sixth configuration example is shown in FIGS. 26A and 26B. FIG. 26A is a plan view near an emitting part in the surface-emitting laser device 100F, and FIG. 26B is a cross-sectional view taken parallel along an X-Z plane in the surface-emitting laser device 100F. Note that in FIG. 26A, symbol L41 represents a length of about 13 μm, symbol L42 represents a length of about 5 μm, and symbol L43 represents a length of about 2 μm.

The surface-emitting laser device 100F is different from the surface-emitting laser device 100D in that a high reflectance region (a region having a relatively high reflectance) has shape anisotropy in an X-axis direction and a Y-axis direction. In this case, since the light confinement action has anisotropy, a polarization direction is defined in a characteristic direction. As a result, the surface-emitting laser device having a more stable polarization direction can be obtained.

Figure 27A:
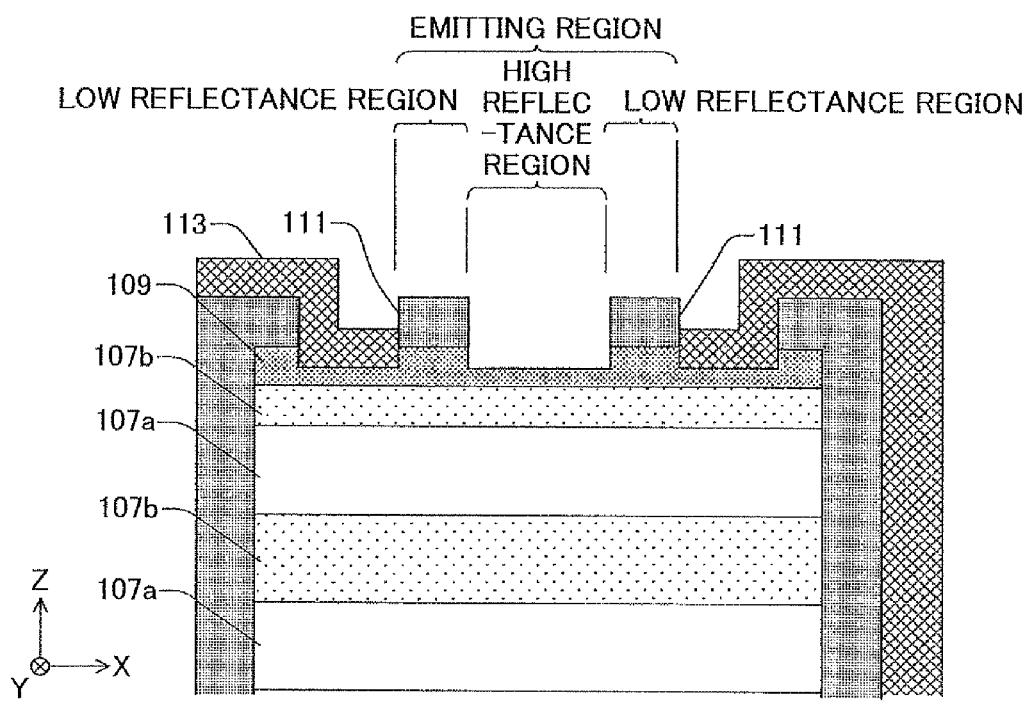
FIGS. 27A and 27B are partially-enlarged views of the surface-emitting laser device 100F in FIG. 26B.
Figure 27B:
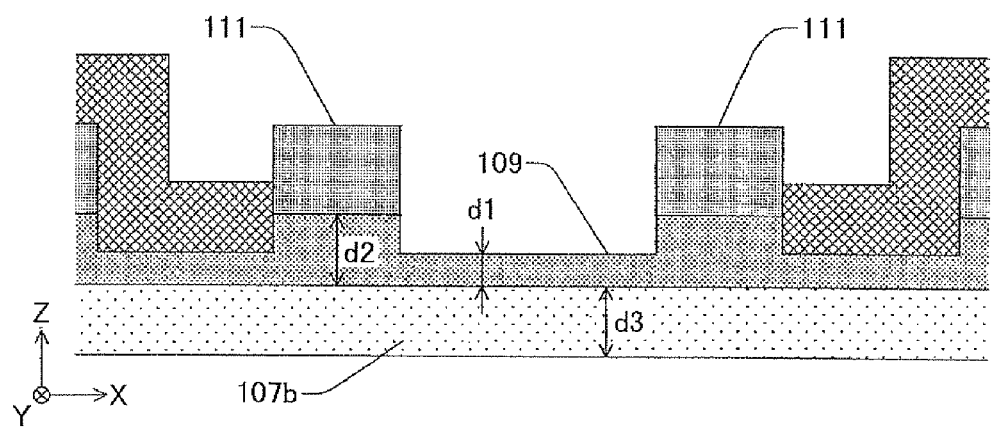

That is, in the surface-emitting laser device 100F, dielectric layers are provided in low reflectance regions, the thickness of a contact layer 109 in the high reflectance region (a region having a relatively high reflectance) is different from that of the contact layer 109 in the low reflectance regions, and the total optical thickness of the outermost-front-surface high refractive index layer (including ½ of the composition inclined layer) and the contact layer 109 in the low reflectance regions is deviated from $\lambda/4$ (see FIGS. 27A and 27B).

In this case, like the surface-emitting laser device 100D, a reflectance difference between the low reflectance regions and the high reflectance region can be increased more than ever before. As a result, a greater oscillation suppressing effect can be obtained in the high-order side mode.

Meanwhile, the low reflectance regions of the surface-emitting laser device 100F are slightly smaller than that of the surface-emitting laser device 100D. Therefore, the surface-emitting laser device 100F has a slightly lower output in the basic side mode than the surface-emitting laser device 100D.

However, in the surface-emitting laser device 100F, a substantially high output of 2.0 mW or more was obtained in the basic side mode even if the area of its current passing region is 30 μm².

Figure 28:
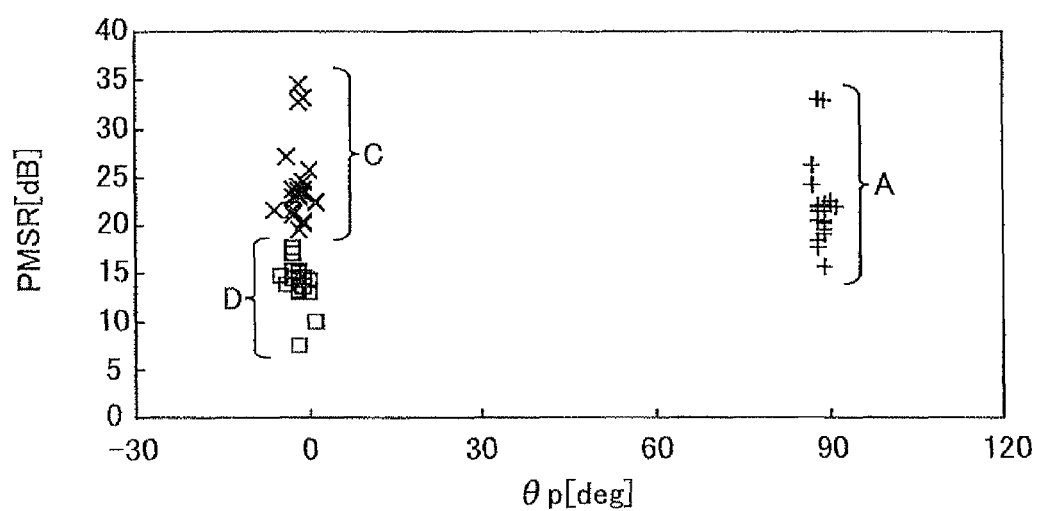
FIG. 28 is a graph for explaining a relationship between a polarization mode suppression ratio (PMSR) and a polarization angle θp.

Further, a relationship between a PMSR (Polarization Mode Suppression Ratio) and a polarization angle in the surface-emitting laser device 100F was found. The result is shown in FIG. 28 together with the results of a modified example and a comparative example. Here, a Y-axis direction represents a polarization angle of zero degrees ($\theta p$=zero degrees), and an X-axis direction represents a polarization angle of 90 degrees ($\theta p$=90 degrees).

Figure 29:
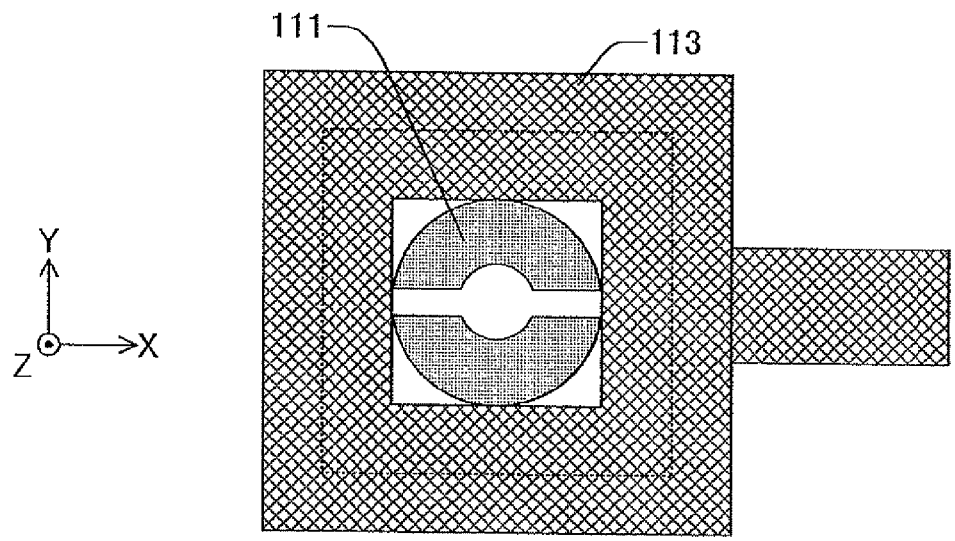
FIG. 29 is a view for explaining a surface-emitting laser device (modified example) corresponding to symbol C in FIG. 28.
Figure 30:
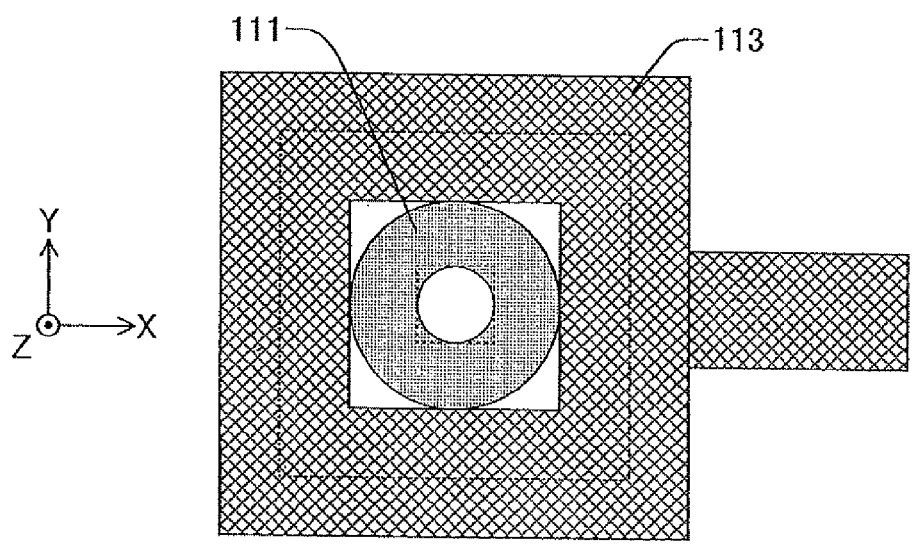
FIG. 30 is a view for explaining a surface-emitting laser device (comparative example) corresponding to symbol D in FIG. 28.

Symbol A in FIG. 28 shows the result of the surface-emitting laser device 100F. Symbol C in FIG. 28 shows the result of a surface-emitting laser device (modified example) equivalent to a case where the low reflectance region of the surface-emitting laser device 100F is rotated by 90 degrees about a Z-axis as shown in FIG. 29 as an example. Further, symbol D in FIG. 28 shows the result of a surface-emitting laser device (comparative example) where a small region surrounding a central part is provided in an emitting region and a transparent dielectric film having an optical thickness of $\lambda/4$ is formed in the emitting region.

In the case of symbol A, a polarization direction was stable in the X-axis direction. Further, in the case of symbol C, a polarization direction was stable in the Y-axis direction. Further, the polarization mode suppression ratios of symbol A and symbol C were greater than that of symbol D by about 5 dB or more. On the other hand, in the case of symbol D, the polarization direction was stable in the X-axis direction, but its polarization mode suppression ratio was below 10 dB. Therefore, the polarization direction was sometimes unstable.

The reason why plural small regions including the transparent dielectric layer having an optical thickness of $\lambda/4$ improved polarization stability is possibly caused by anisotropy occurring in light confinement action in the two directions (here, the X-axis direction and the Y-axis direction) orthogonal to each other. In the surface-emitting laser device 100F, light whose polarization direction corresponds to the X-axis direction have confinement action to the central part of the emitting region having a higher reflectance than the peripheral part of the emitting region, and has a smaller oscillation threshold than light whose polarization direction corresponds to the Y-axis direction. As a result, the polarization mode suppression ration was improved.

Note that the description here is made of a case in which the two low reflectance regions are provided so as to be symmetrical to each other about an axis passing through the center of the emitting region and parallel to the Y-axis. However, the provision of the two low reflectance regions is not limited to this. The two low reflectance regions are only required to be provided on one side and the other side of the axis passing through the center of the emitting region and parallel to the Y-axis.

Further, the description here is made of a case in which the shapes of the respective low reflectance regions are those obtained by dividing a doughnut into two pieces. However, the shapes of the respective low reflectance regions are not limited to this. The shapes of the respective low reflectance regions may be a shape such as a rectangular shape, a semicircular shape, an elliptical shape, and the like.

Further, in this case, even if the outermost-front-surface high refractive index layer is provided right below the dielectric layer like the fifth configuration example, a similar effect can be obtained.

Seventh Configuration Example

Figure 31A:
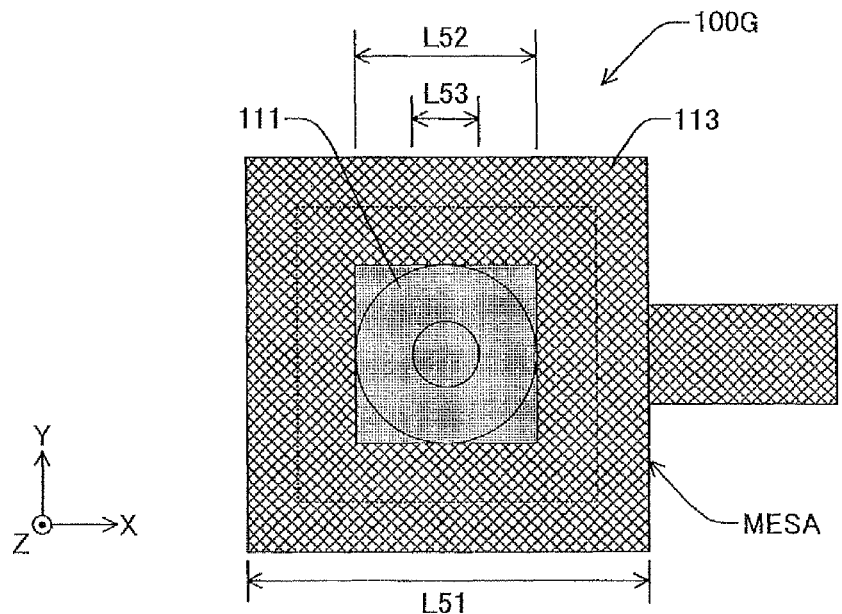
FIGS. 31A and 31B are views for explaining a surface-emitting laser device 1000 according to a seventh configuration example.
Figure 31B:
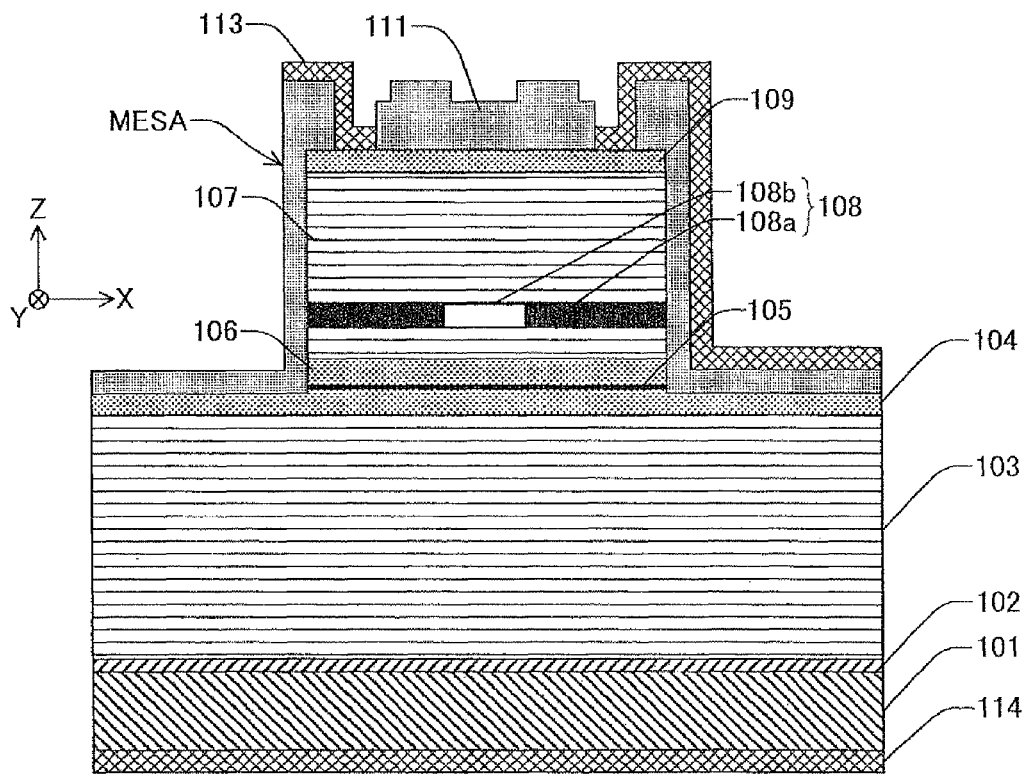
Figure 32A:
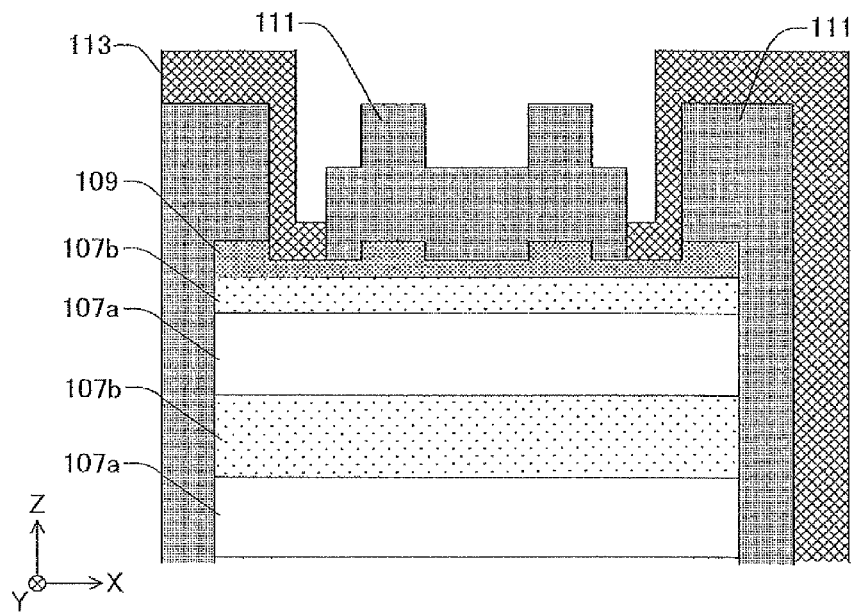
FIGS. 32A and 32B are partially-enlarged views of the surface-emitting laser device 1000 in FIG. 31B.
Figure 32B:
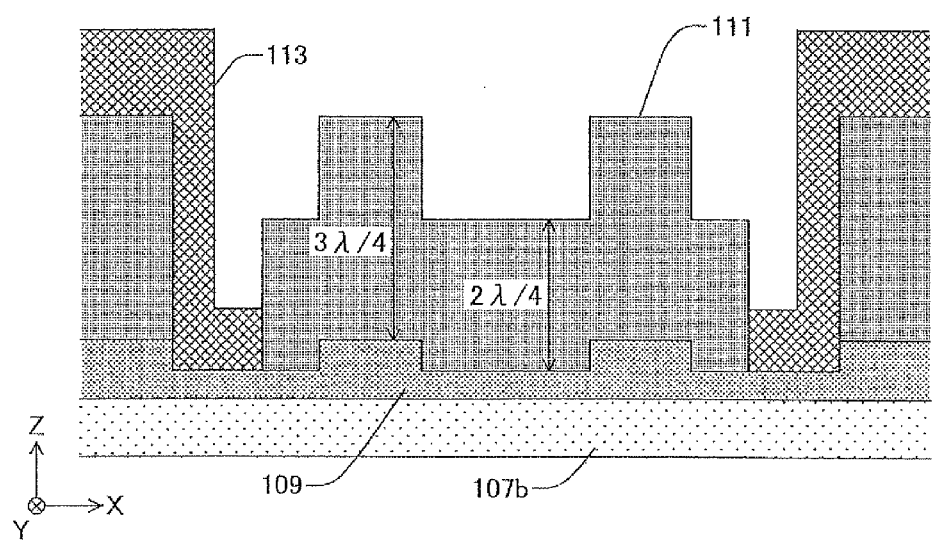

A surface-emitting laser device 1000 according to a seventh configuration example is shown in FIGS. 31A and 32B. FIG. 31A is a plan view near an emitting part in the surface-emitting laser device 1000, and FIG. 31B is a cross-sectional view taken parallel along an X-Z plane in the surface-emitting laser device 100G. Note that in FIG. 31A, symbol L51 represents a length of about 25 μm, symbol L52 represents a length of about 13 μm, and symbol L53 represents a length of about 5 μm.

The surface-emitting laser device 100G is different from the surface-emitting laser device 100A in that it has a dielectric layer made of a single material.

Here, the thickness of a contact layer 109 is 40 nm, and the total optical thickness of an outermost-front-surface high refractive index layer (including ½ of a composition inclined layer) and the contact layer 109 is set to be $\lambda/4$ if the thickness of the contact layer 109 is 25 nm.

A method for manufacturing the surface-emitting laser device 1000 is described.

(G1) A laminated body is formed by crystal growth using a metal organic chemical vapor deposition method (MOCVD method) or a molecular beam epitaxial growing method (MBE method).

(G2) A dielectric layer 111 made of SiN is formed by a chemical vapor deposition method (CVD method). Here, the dielectric layer 111 is set to have an optical thickness of $\lambda/4$. Specifically, since SiN has a refractive index n of 1.86 and an oscillation wavelength $\lambda$ of 780 nm, a film thickness ($=\lambda/4n$) is set to be about 105 nm.

(G3) An etching mask is formed that includes a resist pattern (first pattern) for masking a region corresponding to a part having a high reflectance in an emitting region and a resist pattern (second pattern) for defining the outer shape of a mesa. Here, the first pattern is a doughnut-shaped pattern having an outer diameter L52 (here about 13 μm) and an inner diameter L53 (here about 5 μm). Further, the second pattern forms a square shape as its outer shape having a length of L51 (here about 25 μm), and is a closed pattern having a width of about 2 μm.

(G4) The dielectric layer 111 is etched by wet etching using buffered hydrofluoric acid (BHF). Thus, the dielectric layer 111 corresponding to a part that is not masked by the etching mask is removed.

(G5) A resist pattern that covers a region surrounded by the second pattern is formed.

(G6) The laminated body is etched by an ECR etching method using $Cl_2$ gas to form a quadrangular-column-shaped mesa having at least a selective oxidized layer 108 exposed at its side surface. Here, etching is performed down to a lower spacer layer.

(G7) The respective resist patterns are removed.

(G8) The laminated body is heat-treated in water vapor. Thus, Al (aluminum) of the selective oxidized layer 108 is selectively oxidized from the peripheral part of the mesa. Then, a non-oxidized region 108b surrounded by an oxide 108a of Al is caused to remain at the center of the mesa. That is, an oxidized confinement structure is formed that allows the driving current of a light-emitting part to be supplied only at the center of the mesa. The non-oxidized region 108b is a current passing region. Thus, the substantially-square-shaped current passing region having a width of, for example, 4 through 6 μm is formed. Further, at the same time, the front surface of the exposed part of the contact layer 109 is oxidized to form a soluble part soluble in acid and an alkali solution. Here, the soluble part has a depth of about 15 nm.

(G9) The laminated body is immersed in ammonia water for 40 seconds. Thus, the soluble part of the contact layer 109 is removed. Note that the ammonia water is used here to remove the soluble part, but acid and other alkali solutions may be used. For example, a hydrochloric acid solution, a phosphoric acid solution, an alkali developing solution, or the like may be used.

(G10) A dielectric layer 111 made of SiN is formed by a chemical vapor deposition method (CVD method). Here, the dielectric layer 111 is set to have an optical thickness of $2\lambda/4$.

Specifically, since SiN has a refractive index n of 1.86 and an oscillation wavelength λ of 780 nm, a film thickness (=λ/4n) is set to be about 210 nm.

Then, processes similar to the processes (A11) through (A18) of the first configuration example are performed.

In the surface-emitting laser device 1000 thus manufactured, the dielectric layer 111 having an optical thickness of 3λ/4 is provided at the peripheral part of the emitting region, and the dielectric layer 111 having an optical thickness of 2λ/4 is provided at the central part of the emitting region (FIGS. 32A and 32B).

Further, the thickness of the contact layer 109 in the high reflectance region is 25 nm, and the thickness of the contact layer 109 in the low reflectance region is 33 nm.

At this time, in the high reflectance region, the total optical thickness of the contact layer 109 and the outermost-front-surface high refractive index layer (including ½ of the composition inclined layer) is λ/4. Further, in the low reflectance region, the total optical thickness of the contact layer 109 and the outermost-front-surface high refractive index layer (including ½ of the composition inclined layer) is greater than λ/4.

That is, in the surface-emitting laser device 1000, the dielectric layers are provided in each of the high reflectance region and the low reflectance region, the thickness of the contact layer 109 in the high reflectance region is different from that of the contact layer 109 in the low reflectance region, and the total optical thickness of the outermost-front-surface high refractive index layer (including ½ of the composition inclined layer) and the contact layer 109 in the low reflectance region is deviated from λ/4.

In this case, a reflectance difference between the low reflectance region and the high reflectance region can be increased more than ever before. As a result, a greater oscillation suppressing effect can be obtained in the high-order side mode.

Further, the surface-emitting laser device 1000 is structured such that the emitting region is protected by the dielectric layers. Therefore, oxidation and contamination under environment atmosphere, breakage of the device caused when an Al containing layer takes up moisture in an external environment, or the like can be prevented. That is, a surface-emitting laser device excellent in long term reliability can be obtained.

Further, the description here is made of a case in which the optical thickness of the dielectric layer in the low reflectance region is 3λ/4 and that of the dielectric layer in the high reflectance region is 2λ/4. However, the thicknesses of the dielectric layers in the low reflectance region and the high reflectance region are not limited to them. For example, the optical thickness of the dielectric layer in the low reflectance region may be 5λ/4, and the optical thickness of the dielectric layer in the high reflectance region may be 4λ/4. In short, if the optical thickness of the dielectric layer in the low reflectance region is an odd number multiple of λ/4 and that of the dielectric layer in the high reflectance region is an even number multiple of λ/4, the oscillation suppressing effect in the high-order side mode can be obtained like the surface-emitting laser device 100G and excellent long term reliability can be obtained due to the emitting region being protected.

As described above, each of the surface-emitting laser devices has the lower semiconductor DBR 103, the oscillation structure including the active layer 105, the upper semiconductor DBR 107 including the selective oxidized layer 108, and the like laminated on the substrate 101.

Further, in each of the surface-emitting laser devices 100A, 100C, 100D, 100F, and 100G, the transparent dielectric layers are formed that are provided in the emitting region and causes a reflectance at the peripheral part to be different from a reflectance at the central part in the emitting region. The thickness of the contact layer is different between the region having a relatively high reflectance and the region having a relatively low reflectance in the emitting region. The contact layer is provided on the outermost-front-surface high refractive index layer of the upper semiconductor DBR 107. In the region having a relatively low reflectance, the total optical thickness of the outermost-front-surface high refractive index layer and the contact layer is deviated from an odd number multiple of "oscillation wavelength/4."

Further, in each of the surface-emitting laser devices 100B and 100E, the transparent dielectric layers are formed that are provided in the emitting region and causes a reflectance at the peripheral part to be different from a reflectance at the central part in the emitting region. The dielectric layers are provided on the outermost-front-surface high refractive index layer. The thickness of the outermost-front-surface high refractive index layer is different between the region having a relatively high reflectance and the region having a relatively low reflectance in the emitting region. In the region having a relatively low reflectance, the optical thickness of the outermost-front-surface high refractive index layer is deviated from an odd number multiple of "oscillation wavelength/4."

In this case, oscillations in the high-order side mode can be suppressed without reducing a light output in the basic side mode.

In the optical scanner 1010 according to the embodiment, the light source 14 has any one of the surface-emitting laser devices 100A through 100F. Therefore, the optical scanner 1010 can form a minute beam spot, which is circular and has high light density, into an image on the photosensitive drum. Thus, the optical scanner 1010 is allowed to perform optical scanning with high accuracy.

The laser printer 1000 according to the embodiment has the optical scanner 1010. Therefore, the laser printer 1000 is allowed to form a high-quality image.

Figure 33:
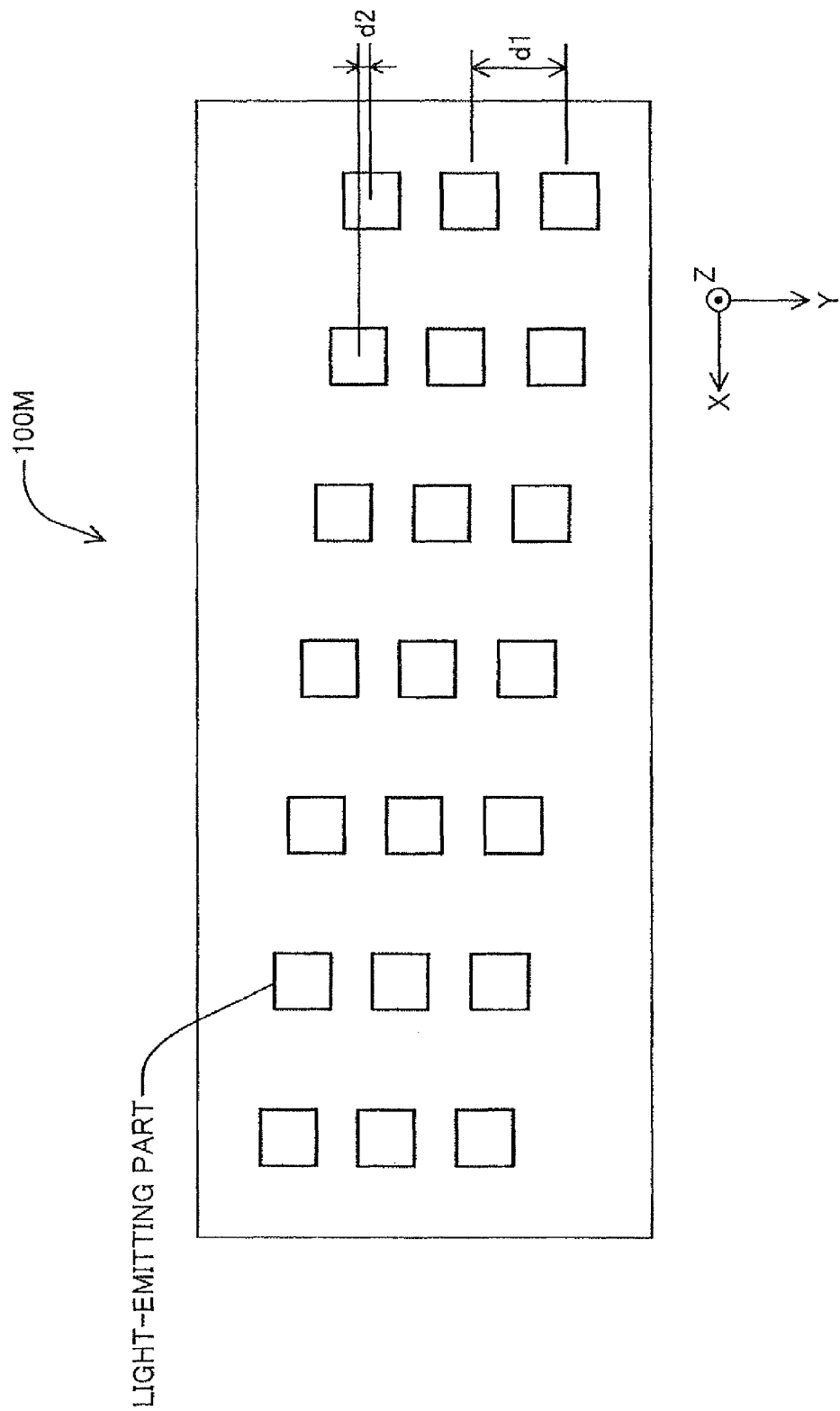
FIG. 33 is a view for explaining a surface-emitting laser array.

Further, in the embodiment described above, the light source 14 may have a surface-emitting laser array 100M as shown in FIG. 33 as an example instead of the surface-emitting laser devices 100A through 100F.

The surface-emitting laser array 100M has plural (here, 21 pieces of) light-emitting parts two-dimensionally arranged on the same substrate. Here, an X-axis direction in FIG. 33 represents a main scanning corresponding direction, and a Y-axis direction represents a sub-scanning corresponding direction. The plural light-emitting parts are arranged such that an interval between the light-emitting parts becomes an equal interval d2 when all the light-emitting parts are orthogonally projected on an imaginary line extending in the Y-axis direction. Note that in this specification, the "interval between the light-emitting parts" refers to a distance between the centers of two light-emitting parts. Note that the number of the light-emitting parts is not limited to 21.

Each of the plural light-emitting parts has a structure similar to any one of the surface-emitting laser devices 100A through 100F and can be manufactured in a manner similar to the surface-emitting laser devices 100A through 100F. Therefore, the surface-emitting laser array 100M can suppress oscillations in the high-order side mode without reducing an output in the basic side mode. Accordingly, the surface-emitting laser array 100M is allowed to simultaneously form 21 minute light spots, which are circular and have high light density, at a desired position on the photosensitive drum 1030.

Further, in the surface-emitting laser array 100M, the interval between the light-emitting parts becomes the equal interval d2 when all the light-emitting parts are orthogonally projected on an imaginary line extending in the sub-scanning corresponding direction. Therefore, with the adjustment of the timing of lighting of the light-emitting parts, it can be recognized as a configuration in which the light-emitting parts are arranged at equal intervals in the sub-scanning direction on the photosensitive drum 1030.

If the interval d2 is 2.65 and the magnification of the optical system of the optical scanner 1010 is about 2, high-density writing at 4800 dpi (dot per inch) can be realized. Of course, if the number of the light-emitting parts in the main-scanning corresponding direction is increased, or if the surface-emitting laser arrays are arranged such that the interval d1 is narrowed to further narrow the interval d2, or if the magnification of the optical system is reduced, more high-density and more high-quality printing can be made possible. Note that a writing interval in the main scanning direction can be easily controlled with the timing of lighting the light-emitting parts.

In this case, the laser printer 1000 can perform printing without losing its printing speed even if writing dot density is increased. Moreover, the laser printer 1000 can further increase its printing speed if the writing dot density remains the same.

Further, in the embodiment described above, instead of the surface-emitting laser devices 100A through 100F, a surface-emitting laser array may be used which is manufactured in a manner similar to the surface-emitting laser devices 100A through 100F and in which light-emitting parts similar to those of the surface-emitting laser devices 100A through 100F are one-dimensionally arranged.

Further, in the embodiment described above, the light-emitting parts have an oscillation wavelength of a 780 nm band. However, the oscillation wavelength of the light-emitting parts is not limited to this. The oscillation wavelength may be changed in accordance with the characteristics of the photosensitive body.

Further, each of the surface-emitting laser devices and the surface-emitting laser array described above can be applied not only to the image forming apparatus but also for other purposes. In this case, the light-emitting parts may have an oscillation wavelength of a 650 nm band, a 850 nm band, a 980 nm band, a 1.3 μm band, a 1.5 μm band, or the like in accordance with intended purposes. In this case, a semiconductor material forming an active layer may include a mixed crystal semiconductor material in accordance with an oscillation wavelength. For example, an AlGaInP system mixed crystal semiconductor material, an InGaAs system mixed material semiconductor material, an InGaAs system mixed crystal semiconductor material, and a GaInNAs(Sb) system mixed crystal semiconductor material may be used at a 650 nm band, a 980 nm band, a 1.3 μm band, and a 1.5 μm band, respectively.

Further, in the embodiment described above, the laser printer 1000 is used as the image forming apparatus. However, the image forming apparatus is not limited to this.

For example, an image forming apparatus may be used which directly applies laser light to a medium (such as a sheet) that develops a color with laser light.

For example, the medium may be a printing plate known as a CTP (Computer To Plate). That is, the optical scanner 1010 is also suitable for an image forming apparatus that directly performs image formation on a printing plate material with laser ablation to form a printing plate.

Further, the medium may be, for example, rewritable paper. This refers to a supporting member such as a paper and a resin film on which a material described below is coated as a recording layer. Further, the medium is caused to impart reversibility to color-developing by heat energy control using laser light, thus reversibly performing its displaying/erasing operations.

There are provided a transparent-opaque type rewritable marking method and a color developing-and-erasing type marking method using a leuco dye.

The transparent-opaque type method includes dispersing fine particles of fatty acid into a thin polymer film and melting the fatty acid causing its resin to expand when the temperature reaches 110° C. or more. The liquid fatty acid is then brought to a supercooled state whereby the expanding resin is solidified. Thus, the fatty acid is solidified and constricted to form polycrystalline fine particles, and gaps are generated between the resin and the fine particles. Due to the gaps, light is scattered to cause a white color to appear. Next, when being heated at an erasing temperature of 80 through 110° C., some of the fatty acid is melted and the resin heat-expands and fills in the gaps. When being cooled in this state, the transparent-opaque type is brought into a transparent state and an image is erased.

The rewritable marking method incorporating a leuco dye uses a reversible color developing-and-erasing reaction of a colorless leuco type dye and a developer having a long-chain alkyl group. The leuco dye and the developer are caused to react with each other to develop a color by heating using laser light, and a colored state is maintained if they are rapidly cooled directly. After heating, phase separation occurs due to autoagglutination of the long-chain alkyl group of the developer when the long-chain alkyl group is slowly cooled. Thus, the leuco dye and the developer are physically separated from each other, thereby erasing the color.

Further, the medium may be color rewritable paper. The color rewritable paper includes a photochromic compound that develops a C (cyan) color when radiated with ultraviolet light and erases the color with visible R (red) light, a photochromic compound that develops a M (magenta) color when being radiated with ultraviolet light and erases the color with visible G (green) light, and a photochromic compound that develops a Y (yellow) color when radiated with ultraviolet light and erases the color with visible B (blue) light. These photochromic compounds are provided on a supporting body such as a paper or a resin film.

In this case, the color rewritable paper is temporarily radiated with ultraviolet light so as to be inky black, and the color developing densities of the three types of materials that develop the Y, M, and C colors are controlled in accordance with the time and the intensity for radiating the R, G, and B light to express a full color. If the radiation of the R, G, and B light is made strong and continuous, the three types of materials can be erased to become plain white.

An image forming apparatus having an optical scanner similar to that of the embodiment can realize the medium described above caused to impart reversibility to color-developing by light energy control.

Further, an image forming apparatus, which uses a silver halide film as an image carrier, may be used. In this case, a latent image is formed on the silver halide film by optical scanning. The formed latent image can be visualized by a process similar to a development process in a general silver halide photography process. Then, the latent image can be transferred to a printing sheet by a process similar to a baking process in the general silver halide photography process. Such an image forming apparatus can be implemented as a light plate-making apparatus and a light drawing apparatus that draws a CT-scanning image or the like.

Figure 34:
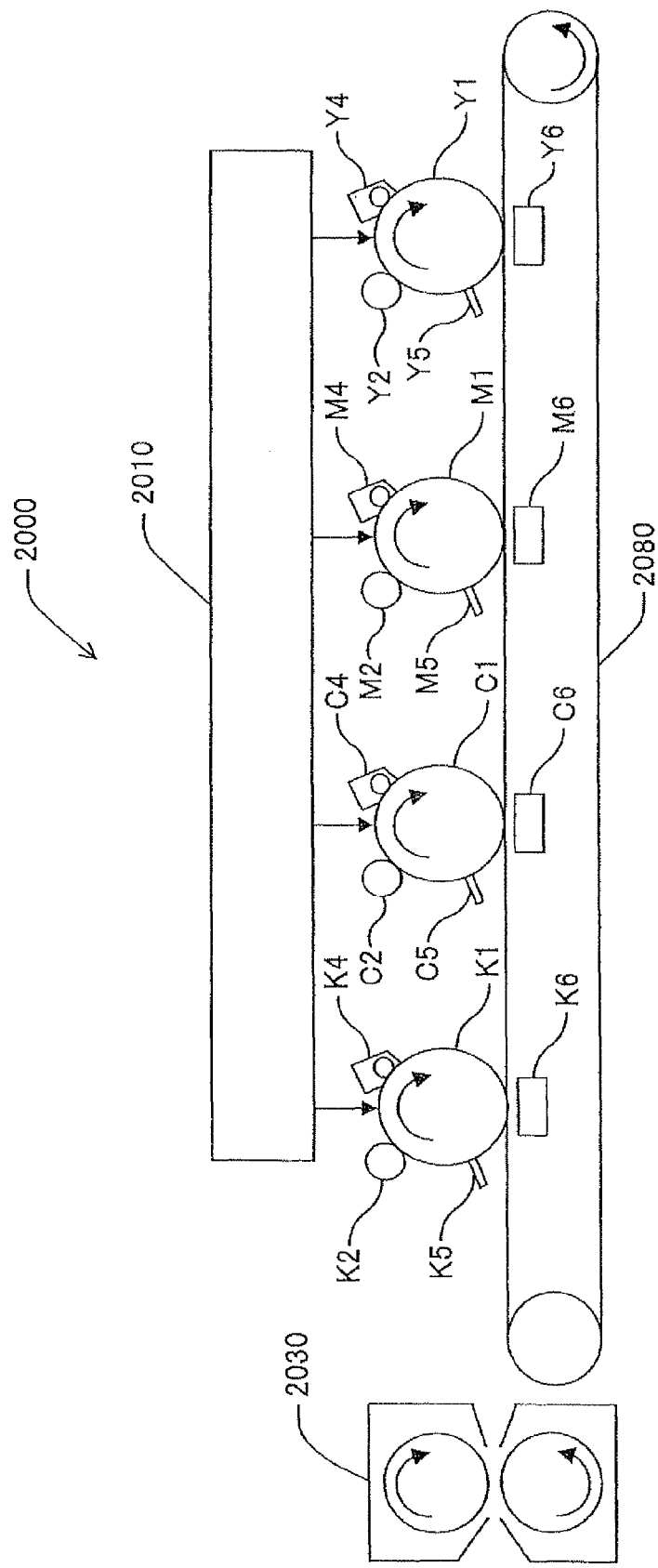
FIG. 34 is a view for explaining the schematic configuration of a multicolor printer.

Further, as shown in FIG. 34 as an example, a color printer 2000 having plural photosensitive drums may be used.

The color printer 2000 is a tandem-type multicolor printer that forms a full-color image by superposing four colors (black, cyan, magenta, and yellow) one on another. The color printer 2000 has components for black consisting of a photosensitive drum K1, a charging unit K2, a developing unit K4, a cleaning unit K5, and a transfer unit K6; components for cyan consisting of a photosensitive drum C1, a charging unit C2, a developing unit C4, a cleaning unit C5, and a transfer unit C6; components for magenta consisting of a photosensitive drum M1, a charging unit M2, a developing unit M4, a cleaning unit M5, and a transfer unit M6; components for yellow consisting of a photosensitive drum Y1, a charging unit Y2, a developing unit Y4, a cleaning unit Y5, and a transfer unit Y6; an optical scanner 2010; a transfer belt 2080; a fixing unit 2030; and the like.

The photosensitive drums rotate in the direction as indicated by the arrows in FIG. 34. At the periphery of each of the photosensitive drums, the charging unit, the developing unit, the transfer unit, and the cleaning unit are arranged in the rotating direction. The charging units uniformly charge the front surface of the corresponding photosensitive drums. The optical scanner 2010 applies light to the charged front surface of each of the photosensitive drums to form a latent image on each of the photosensitive drums. Then, a toner image is formed on the front surface of each of the photosensitive drums by the corresponding developing unit. Moreover, the toner images in each of the colors are transferred to a recording sheet on the transfer belt 2080 by the corresponding transfer units. Finally, an image is fixed to the recording sheet by the fixing unit 2030.

The optical scanner 2010 has a light source including any one of a surface-emitting laser device and a surface-emitting laser array manufactured in a manner similar to any one of the surface-emitting laser devices 100A through 100F for each color. Therefore, the optical scanner 2010 can obtain effects similar to those of the optical scanner 1010. Further, with the provision of the optical scanner 2010, the color printer 2000 can obtain effects similar to those of the laser printer 1000.

Meanwhile, in the color printer 2000, a color shift may occur due to a manufacturing error, a positional error, or the like of the components. Even in this case, since each of the light sources of the optical scanner 2010 has a surface-emitting laser array similar to the surface-emitting laser array 100M, the color printer 2000 can reduce the color shift by selecting the light-emitting parts to be lighted.

As described above, the surface-emitting laser device and the surface-emitting laser array according to the embodiment of the present invention are suitable for suppressing oscillations in the high-order side mode without reducing a light output in the basic side mode. Further, the optical scanner according to the embodiment of the present invention is suitable for performing optical scanning with high accuracy. Further, the image forming apparatus according to the embodiment of the present invention is suitable for forming a high-quality image. Further, the method for manufacturing the surface-emitting laser device according to the embodiment of the present invention is suitable for stably mass-producing the surface-emitting laser device in which oscillations in the high-order side mode are suppressed without reducing a light output in the basic side mode.

The present application is based on Japanese Priority Application Nos. 2010-118940 filed on May 25, 2010 and 2011-050962 filed on Mar. 9, 2011, with the Japan Patent Office, the entire contents of which are hereby incorporated by reference.

The invention claimed is:

1. A surface-emitting laser device, comprising:
a lower multilayer film reflecting mirror;
a resonator structure having an active layer;
an upper multilayer film reflecting mirror;
a contact layer on which an electrode is provided;
a substrate on which the lower multilayer film reflecting mirror, the resonator structure, the upper multilayer film reflecting mirror, and the contact layer are laminated; and
a transparent dielectric layer provided in an emitting region surrounded by the electrode and configured to cause a reflectance at a peripheral part to be different from a reflectance at a central part in the emitting region;
wherein a thickness of the contact layer is different between a region having a relatively high reflectance and a region having a relatively low reflectance in the emitting region, and a difference in an optical thickness of the contact layer between the region having the relatively high reflectance and the region having the relatively low reflectance in the emitting region is less than a one quarter oscillation wavelength of laser light emitted from the emitting region,
wherein the contact layer is provided on a high refractive index layer of the upper multilayer film reflecting mirror,
wherein a total optical thickness of the high refractive index layer and the contact layer in the region having the relatively low reflectance is deviated from an odd number multiple of a one quarter oscillation wavelength of laser light emitted from the emitting region, and
a reflectance difference between the region having the relatively high reflectance and the region having the relatively low reflectance is greater than a case in which the total optical thickness of the high refractive index layer and the contact layer is the odd number multiple of the one quarter oscillation wavelength.

2. The surface-emitting laser device according to claim 1, wherein the transparent dielectric layer is provided in at least the region having the relatively high reflectance and includes plural dielectric films of different materials laminated one on another, and
wherein a thickness of a semiconductor layer provided right below the transparent dielectric layer in the region having the relatively high reflectance is greater than a thickness of the semiconductor layer in the region having the relatively low reflectance.

3. The surface-emitting laser device according to claim 2, wherein an optical thickness of the semiconductor layer provided right below the transparent dielectric layer is smaller than the quarter oscillation wavelength by at least 10 nm in the region having the relatively low reflectance.

4. The surface-emitting laser device according to claim 2, wherein a dielectric layer is provided in the region having the relatively low reflectance, and
wherein an optical thickness of the dielectric layer provided in the region having the relatively low reflectance is an odd number multiple of the quarter oscillation wavelength.

5. The surface-emitting laser device according to claim 1, wherein the transparent dielectric layer is provided in at least the region having the relatively low reflectance and is made of a single material, and
wherein a thickness of a semiconductor layer provided right below the transparent dielectric layer in the region having the relatively low reflectance is greater than a thickness of the semiconductor layer in the region having the relatively high reflectance.

6. The surface-emitting laser device according to claim 1, wherein the region having the relatively high reflectance has shape anisotropy in two directions orthogonal to each other in a plane parallel to the emitting region.

7. A surface-emitting laser array in which the surface-emitting laser device according to claim 1 is integrated.

8. An optical scanner comprising:
a light source having the surface-emitting laser device according to claim 1;
a deflector configured to deflect the light from the light source; and
a scanning optical system configured to condense the light deflected by the deflector onto the surface to be scanned.

9. An image forming apparatus comprising:
at least one image carrier; and
the at least one optical scanner according to claim 8 configured to scan the at least one image carrier with the light modulated in accordance with image information.

10. A surface-emitting laser device, comprising:
a lower multilayer film reflecting mirror;
a resonator structure having an active layer;
an upper multilayer film reflecting mirror;
a contact layer on which an electrode is provided;
a substrate on which the lower multilayer film reflecting mirror the resonator structure, the upper multilayer film reflecting mirror, and the contact layer are laminated; and
a transparent dielectric layer provided in an emitting region surrounded by the electrode and configured to cause a reflectance at a peripheral part to be different from a reflectance at a central part in the emitting region;
wherein a thickness of the contact layer is different between a region having a relatively high reflectance and a region having a relatively low reflectance in the emitting region,
wherein the contact layer is provided on a high refractive index layer of the upper multilayer film reflecting mirror,
wherein a total optical thickness of the high refractive index layer and the contact layer in the region having the relatively low reflectance is deviated from an odd number multiple of a one quarter oscillation wavelength of laser light emitted from the emitting region, and
a reflectance difference between the region having the relatively high reflectance and the region having the relatively low reflectance is greater than a case in which the total optical thickness of the high refractive index layer and the contact layer is the odd number multiple of the one quarter oscillation wavelength,
wherein the transparent dielectric layer is provided in at least the region having the relatively low reflectance and is made of a single material,
wherein a thickness of a semiconductor layer provided right below the transparent dielectric layer in the region having the relatively low reflectance is greater than a thickness of the semiconductor layer in the region having the relatively high reflectance,
wherein a dielectric layer made of a material same as the material of the transparent dielectric layer provided in the region having the relatively low reflectance is provided in the region having the relatively high reflectance, and
wherein an optical thickness of the dielectric layer provided in the region having the relatively high reflectance is an even number multiple of the quarter oscillation wavelength.

* * * * *